United States Patent
Bonnet et al.

(10) Patent No.: US 12,374,397 B2
(45) Date of Patent: Jul. 29, 2025

(54) MEMORY CELL, ELECTRONIC CIRCUIT COMPRISING SUCH CELLS, RELATED PROGRAMMING METHOD AND MULTIPLICATION AND ACCUMULATION METHOD

(71) Applicants: Commissariat à l'énergie atomique et aux énergies alternatives, Paris (FR); Université d'Aix-Marseille, Marseilles (FR); Centre national de la recherche scientifique, Paris (FR)

(72) Inventors: Djohan Bonnet, Grenoble (FR); Tifenn Hirtzlin, Grenoble (FR); Elisa Vianello, Grenoble (FR); Eduardo Esmanhotto, Grenoble (FR); Jean-Michel Portal, Saint Savournin (FR)

(73) Assignees: Commissariat à l'énergie atomique et aux énergies alternatives, Paris (FR); Université d'Aix-Marseille, Marseilles (FR); Centre national de la recherche scientifique, Paris (FR)

( * ) Notice: Subject to any disclaimer, the term of this patent is extended or adjusted under 35 U.S.C. 154(b) by 266 days.

(21) Appl. No.: 18/315,117

(22) Filed: May 10, 2023

(65) Prior Publication Data

US 2023/0368839 A1 Nov. 16, 2023

(30) Foreign Application Priority Data

May 11, 2022 (FR) ..................................... 22 04462

(51) Int. Cl.
*G11C 16/08* (2006.01)
*G11C 11/00* (2006.01)
(Continued)

(52) U.S. Cl.
CPC ........ *G11C 13/0069* (2013.01); *G11C 13/004* (2013.01); *G11C 13/0097* (2013.01)

(58) Field of Classification Search
CPC .............. G11C 13/0069; G11C 13/004; G11C 13/0097; G11C 13/0026; G11C 13/0028;
(Continued)

(56) References Cited

U.S. PATENT DOCUMENTS 10,482,953 B1  11/2019  Lin et al.
2012/0287697 A1  11/2012  Hanzawa et al.
(Continued)

FOREIGN PATENT DOCUMENTS

EP       3 522 165 A1    8/2019

OTHER PUBLICATIONS

Preliminary French Search Report issued Dec. 6, 2022 in French Application 22 04462 filed on May 11, 2022, 3 pages (with English Translation of Categories of Cited Documents).
(Continued)

*Primary Examiner* — Hien N Nguyen
(74) *Attorney, Agent, or Firm* — Oblon, McClelland, Maier & Neustadt, L.L.P.

(57) ABSTRACT

A memory cell, includes first and second main terminals, an auxiliary terminal; M memristor(s) between the main terminals, M≥1; M primary switch(es), each in parallel with a memristor; and a secondary switch between the second main terminal and the auxiliary terminal. It is configured for writing to at least one memristor by opening each primary switch in parallel with the at least one memristor, closing each other primary switch, closing the secondary switch and applying a corresponding programming voltage between the first main terminal and the auxiliary terminal; and for reading at least one memristor by opening each primary switch in parallel with the at least one memristor, closing
(Continued)

each other possible primary switch, opening the secondary switch and measuring a corresponding electrical quantity between the main terminals.

22 Claims, 13 Drawing Sheets

(51) Int. Cl.
    *G11C 13/00*     (2006.01)
    *G11C 16/10*     (2006.01)

(58) Field of Classification Search
    CPC ............ G11C 13/003; G11C 2013/005; G11C 2013/009; G11C 2213/75; G11C 2213/79; G11C 2213/82; G11C 13/0007; G11C 11/54
    See application file for complete search history.

(56) References Cited

U.S. PATENT DOCUMENTS

| | | | |
|---|---|---|---|
| 2018/0137916 A1* | 5/2018 | Salama | G11C 13/0023 |
| 2019/0244662 A1* | 8/2019 | Lee | H10B 63/30 |
| 2020/0175363 A1* | 6/2020 | Lin | G06N 3/08 |
| 2020/0192971 A1* | 6/2020 | Lue | G11C 16/0483 |
| 2020/0327401 A1* | 10/2020 | Bates | G11C 11/54 |
| 2022/0375520 A1* | 11/2022 | Yi | G11C 7/1006 |

OTHER PUBLICATIONS

Jung et al., "A crossbar array of magnetoresistive memory devices for in-memory computing", Nature vol. 601, Jan. 2022, 17 pages.

* cited by examiner

MEMORY CELL, ELECTRONIC CIRCUIT COMPRISING SUCH CELLS, RELATED PROGRAMMING METHOD AND MULTIPLICATION AND ACCUMULATION METHOD

CROSS-REFERENCE TO RELATED APPLICATIONS

This application is a U.S. non-provisional application claiming the benefit of French Application No. 22 04462, filed on May 11, 2022, which is incorporated herein by reference in its entirety.

FIELD

The present invention relates to a memory cell for an electronic circuit.

The invention also relates to an electronic circuit comprising value lines, programming lines, source lines, and a set of such memory cells.

The invention also relates to a method of programming at least one memory cell of a respective row of memory cells of such an electronic circuit.

The invention also relates to a method of multiplying and accumulating a set of memory cell(s) of a respective column of memory cells of such an electronic circuit.

The invention relates to multiple applications, among which are automatic data processing, diagnostic assistance, predictive analysis, autonomous vehicles, bioinformatics or surveillance. These applications typically involve the classification or identification of objects previously detected by a sensor, allowing, for example, to recognize or classify the identities of people whose faces have been detected by a face detector, or even to recognize or classify surrounding objects detected by a sensor on board an autonomous vehicle, the recognition or classification of such objects being important for the autonomous driving of such a vehicle.

BACKGROUND

For the multiple applications mentioned above, it is known to use machine learning algorithms that are part of programs that can be executed on processors, such as CPUs (Central Processing Units) or GPUs (Graphics Processing Units).

Among the techniques for implementing learning, the use of neural networks, that is, Artificial Neural Networks (ANNs) known per se, is becoming increasingly widespread, as these structures are considered very promising due to their performance for many tasks such as automatic data classification, pattern recognition, automatic language translation and understanding, robotic control, automatic navigation, recommendation systems, anomaly detection, fraud detection, DNA study or even the discovery of new molecules.

A neural network is generally composed of a succession of layers of neurons, each of which takes its inputs from the outputs of the previous layer. More precisely, each layer comprises neurons taking their inputs from the outputs of the neurons of the previous layer. Each layer is connected by a plurality of synapses. A synaptic weight is associated with each synapse. It is a real number, which takes positive and negative values. For each layer, the input of a neuron is the weighted sum of the outputs of the neurons of the previous layer, the weighting being done by the synaptic weights.

For an implementation in a CPU or GPU, a Von Neumann bottleneck problem appears because the implementation of a deep neural network (with more than three layers and up to several tens) implies to use both the memory(s) and the processor while these last elements are spatially separated. This results in a bottleneck of the communication bus between the memory(s) and the processor both while the trained neural network is being used to perform a task, and even more so, while the neural network is being trained, that is, while its synaptic weights are being trained to solve the task at hand with maximum performance.

It is therefore desirable to develop dedicated hardware architectures, intertwining memory and computation, to realize fast, low-power neural networks capable of learning in real time.

In order to reduce the footprint, it is known to use architectures in which the synapses are memristive. Memristive synapses are synapses using memristors. In electronics, a memristor is a passive electronic component. The name is a crossword formed from the two words memory and resistor. A memristor is a non-volatile memory component, the value of its electrical resistance changing with the application of a voltage for a certain period of time and remaining at this value in the absence of voltage.

An example of such an implementation is proposed in a paper by S. Jung et al. entitled "*A crossbar array of magnetoresistive memory devices for in-memory computing*" published on Jan. 12, 2022, in the journal Nature. The neural network is implemented by a set of 2T2R memory cells, referring to the presence of two switches (called 2T) and two memristors (called 2R) for each memory cell.

However, this implementation is based on a particular neural network which is a binary neural network, or BNN, that is, a network in which the neurons and synapses can only take binary values.

SUMMARY

The purpose of the invention is to propose a memory cell and an associated electronic circuit, allowing the implementation of all types of neural networks, and in particular networks other than binary neural networks.

To this end, the invention has as its object a memory cell comprising:
- a first main terminal, a second main terminal and an auxiliary terminal;
- M memristor(s) connected between the two main terminals, M being an integer greater than or equal to 1;
- M primary switch(es), each connected in parallel to a respective memristor; and
- a secondary switch connected between the second main terminal and the auxiliary terminal;

the memory cell being configured for writing a respective value to at least one memristor via the opening of the or each primary switch in parallel with said at least one memristor, the closing of the or each other possible primary switch, the closing of the secondary switch and applying a corresponding programming voltage between the first main terminal and the auxiliary terminal;

the memory cell being configured to read a respective value in at least one memristor via the opening of the or each primary switch in parallel with said at least one memristor, the closing of the or each other possible primary switch, the opening of the secondary switch and measuring a corresponding electrical quantity between the two main terminals.

With the memory cell according to the invention, the memory cell allows the writing, and then the reading, of any value, in the form of the value of the electrical resistance of a respective memristor included in the memory cell, and not only of a binary value unlike the memory cell of the state of the art.

Preferably, the memory cell further allows the multiplication of a value of a respective memristor by a multiple, via alternating—during an inference cycle—opening and closing of the primary switch in parallel with said memristor. This then typically allows the implementation of a multiplication and accumulation operation, also called MAC (Multiplication and ACcumulation).

During the inference of an artificial neural network, each artificial neuron is typically able to perform a weighted sum of value(s) received as input from element(s) connected to its input, such as the neurons of the previous layer, each input value being then multiplied by a respective synaptic weight value, then applying an activation function, typically a non-linear function, to said weighted sum, and delivering to the element(s) connected to its output the value resulting from the application of said activation function. The memory cell according to the invention, and in particular a set of such memory cells connected in series, are then particularly suitable for efficiently calculating the aforementioned weighted sum.

According to other advantageous aspects of the invention, the memory cell comprises one or more of the following features, taken alone or in any technically possible combination:
- the memory cell is further configured for multiplying a value of at least one respective memristor by a multiple, via alternating opening(s) and closing(s) of the or each primary switch in parallel with said at least one memristor during an inference cycle, closing of the or each other possible primary switch, the opening of the secondary switch and the measurement of a corresponding electrical quantity between the two main terminals, a ratio between a cumulative duration of opening of the or each primary switch in parallel with said at least one memristor during the inference cycle and a duration of said cycle being representative of the multiple;
- the memory cell comprises exactly M memristor(s);
- the memory cell comprises exactly M+1 switches;
- the memory cell being preferably constituted of the first and second main terminals, the auxiliary terminal, the memristor, and the primary and secondary switches;
- the memory cell further comprises M tertiary switches, each connected to a respective memristor, the tertiary switch and the memristor being connected in series, in parallel with the associated primary switch;
- the memory cell being preferably constituted of the first and second main terminals, the auxiliary terminal, the memristor, and the primary, secondary and tertiary switches;
- M is equal to 1, and the memory cell is then configured to write a respective value via the opening of the primary switch, the closing of the secondary switch and the application of a corresponding programming voltage between the first main terminal and the auxiliary terminal; the memory cell being configured to read a respective value via the opening of the primary switch, the opening of the secondary switch and the measuring of a corresponding electrical quantity between the two main terminals;
- M is strictly greater than 1, the M memristors are connected in series between the two main terminals;
- the memory cell is configured for writing a respective value to a memristor via the opening of the primary switch in parallel with said memristor, the closing of the or each other primary switch, the closing the secondary switch and the application of a corresponding programming voltage between the first main terminal and the auxiliary terminal; the memory cell being configured for reading a respective value in a memristor via the opening of the primary switch in parallel with said memristor, closing the or each other primary switch, opening the secondary switch and measuring a corresponding electrical quantity between the two main terminals
- the or each memristor is a resistive memory component selected from among the group consisting of a PCRAM component, an OxRAM component, an MRAM component, and a CBRAM component
- each switch is a transistor;
- each transistor preferably being a field effect transistor, such as an insulated gate field effect transistor, or MOSFET.

The invention also relates to an electronic circuit, comprising:
- value lines;
- programming lines; and
- source lines; and
- a set of memory cells, each memory cell being according to any of the preceding claims,
- for each memory cell, a control electrode of a respective primary switch being connected to a respective value line, a control electrode of the secondary switch being connected to a respective programming line, and the auxiliary terminal being connected to a respective source line.

According to further advantageous aspects of the invention, the electronic circuit comprises one or more of the following features, taken alone or in any technically possible combination:
- the electronic circuit further comprises complementary programming lines, and for each memory cell, a control electrode of a respective tertiary switch is connected to a respective complementary programming line;
- the electronic circuit further comprises multiplexers, each source line being connected to a respective multiplexer, each multiplexer being configured to select, as a function of a selection signal and among several predefined values, an electric potential value to be applied to the associated source line;
- the electronic circuit further comprises auxiliary switches, each source line being connected to a respective auxiliary switch, each auxiliary switch being configured, in case of reception of a limitation command, to limit an electric current flowing in the associated source line;
- each auxiliary switch preferably being a transistor, and the limitation command being a predefined limiting potential applied to a control electrode of said auxiliary switch;
- the electronic circuit preferably further comprising auxiliary multiplexers, the control electrode of each auxiliary switch being connected to a respective auxiliary multiplexer, each auxiliary multiplexer being configured to select, as a function of a limiting signal and from among several predefined values, an electric potential value to be applied to the associated control electrode;

the set of memory cells is arranged in the form of a matrix including rows and columns, the memory cells of the same row being connected to the same value line(s) and to the same source line, and the memory cells of the same column being connected to the same programming line;

the memory cells of a same row are further connected to M same complementary programming line(s);

the electronic circuit further comprises measurement modules, and the memory cells of a same column are connected in series to each other, each column including a first end connected to a reference potential and a second end connected to a respective measurement module, each measurement module being configured to measure a cumulative voltage of the memory cells of the column to which it is connected;

the electronic circuit preferably further comprising a reference line to which the reference potential is applied, the first ends of the columns then being connected to the reference line;

each measurement module, preferably, further including a comparator configured to detect when the cumulative voltage of the memory cells of the respective column reaches a respective predefined threshold voltage.

The invention also relates to a method for programming at least one memory cell of a respective row of memory cells of an electronic circuit as defined above, the method comprising the following steps:

opening primary switches of the memory cells of said row, via the application of an open command on a respective value line connected to said row;

closing any other primary switches of the memory cells of said row, via the application of a close command to the other possible value line(s) connected to said row;

closing the at least one secondary switch of said at least one memory cell, via the application of a close command on the at least one programming line connected to said at least one memory cell of said row;

assigning a value to at least one memristor of said at least one memory cell, with a programming voltage corresponding to the value between the at least one first main terminal and the at least one auxiliary terminal of said at least one memory cell, via the application of a first electric potential to the source line(s) arranged on the side of the at least one first main terminal and of a second electric potential to the other source line(s) arranged on the side of the at least one auxiliary terminal, the programming voltage corresponding to the assigned value being equal to the difference between the first and second potentials, the or each primary switch in parallel with the at least one memristor being open.

According to further advantageous aspects of the invention, the programming method comprises one or more of the following features, taken alone or in any technically possible combination:

the method further comprises, before the assignment step, a step of closing the tertiary switches of the memory cells of said row, via the application of a close command on the complementary programming line or lines connected to said row;

during the assignment step, the first electric potential being preferably applied to the only source line connected to the at least one first main terminal and the second electric potential being applied to the only source line connected to the at least one auxiliary terminal of said row;

the method preferably also comprising, before the assignment step, a step of opening the other tertiary switches, via the application of an open command to the other complementary programming line or lines of the electronic circuit;

the assignment step further includes closing the auxiliary switches connected to the source lines to which one of the first and second potentials is applied;

the auxiliary switch associated with said row preferably being further controlled with a predefined limitation potential applied to its control electrode.

The invention also relates to a method of multiplying and accumulating a set of memory cell(s) of a respective column of memory cells of an electronic circuit as defined above, the method comprising the following steps:

opening the secondary switches of the memory cells of said column, via the application of an open command on the programming line connected to said column;

if said set does not include all of the memory cells of said column, closing each primary switch of each distinct memory cell in said set within said column, via the application of a close command on each value line connected to each distinct memory cell in said set;

controlling each primary switch of said set of memory cell(s) with alternating opening and closing during an inference cycle, via the application of alternating open and close commands on each value line connected to each primary switch of said set, to multiply the value of each memristor of said set by a respective multiple; a ratio between a cumulative duration of opening of the respective primary switch during the inference cycle and a duration of said cycle being representative of the respective multiple;

obtaining a weighted sum of memristor values of said set, each memristor value being multiplied by the respective multiple, via a measurement of the cumulative voltage of the memory cells of said column.

According to another advantageous aspect of the invention, the multiply and accumulate method comprises the following feature:

the method further comprises, before the control step, a step of closing each tertiary switch of said set, via the application of a close command on each complementary programming line connected to each tertiary switch of said set.

The invention also relates to a method of reading at least one memory cell of a respective row of memory cells of an electronic circuit such as defined above, the method comprising the following steps:

opening primary switches of the memory cells of said row, via application of an open command on a respective value line connected to said row;

closing any other primary switches of the memory cells of said row, via the application of a close command to the other possible value line(s) connected to said row;

closing the at least one secondary switch of said at least one memory cell, via the application of a close command to the at least one programming line connected to said at least one memory cell of said row;

reading a value of at least one memristor of said at least one memory cell, with a read voltage between the at least one first main terminal and the at least one auxiliary terminal of said at least one memory cell, via the application of a third electric potential to the source line(s) arranged on the side of the at least one first main terminal and of a fourth electric potential to the other source line(s) arranged on the side of the at least one auxiliary terminal, the read voltage being equal to the difference between the third and fourth potentials, the or each primary switch in parallel with the at least one memristor to be read being open.

The invention also relates to a method of reading a set of memory cells of a respective column of memory cells of an electronic circuit such as defined above, the method comprising the following steps:

opening the secondary switches of the memory cells of said column, via the application of an open command on the programming line connected to said column;

opening the primary switch in parallel with the or each memristor to be read of said set of memory cells, via the application of an open command on the value line connected to each primary switch in parallel with the or each memristor to be read of said set;

closing each other possible primary switch of said set of memory cell(s), via the application of an open command on the value line connected to each other possible primary switch of said set;

if said set does not include all the memory cells in said column, closing each primary switch of each distinct memory cell of said set within said column, via the application of a close command on each value line connected to each distinct memory cell of said set;

reading a sum of memristor values to be read from said set, via a measurement of the cumulative voltage of the memory cells in said column.

According to another advantageous aspect of the invention, the reading method further comprises, before the reading step, a step of closing each tertiary switch of said set, via the application of a close command on each complementary programming line connected to each tertiary switch of said set.

BRIEF DESCRIPTION OF THE DRAWINGS

These features and advantages of the invention will become clearer upon reading the following description, given only as a non-limiting example, and made with reference to the attached drawings, in which.

DETAILED DESCRIPTION

In the present description, unless otherwise specified, when reference is made to two elements being connected to each other, it preferably means that they are connected directly to each other, without any intermediate element between them other than connecting conductors; and when reference is made to two elements being coupled or connected to each other, it means that these two elements are either connected to each other, or coupled or connected to each other through one or more other elements.

In the present description, unless otherwise specified, the terms "substantially," "about," "approximately," and "of the order of" define a relationship of equality to within plus or minus 10%, preferably plus or minus 5%.

Figure 1:
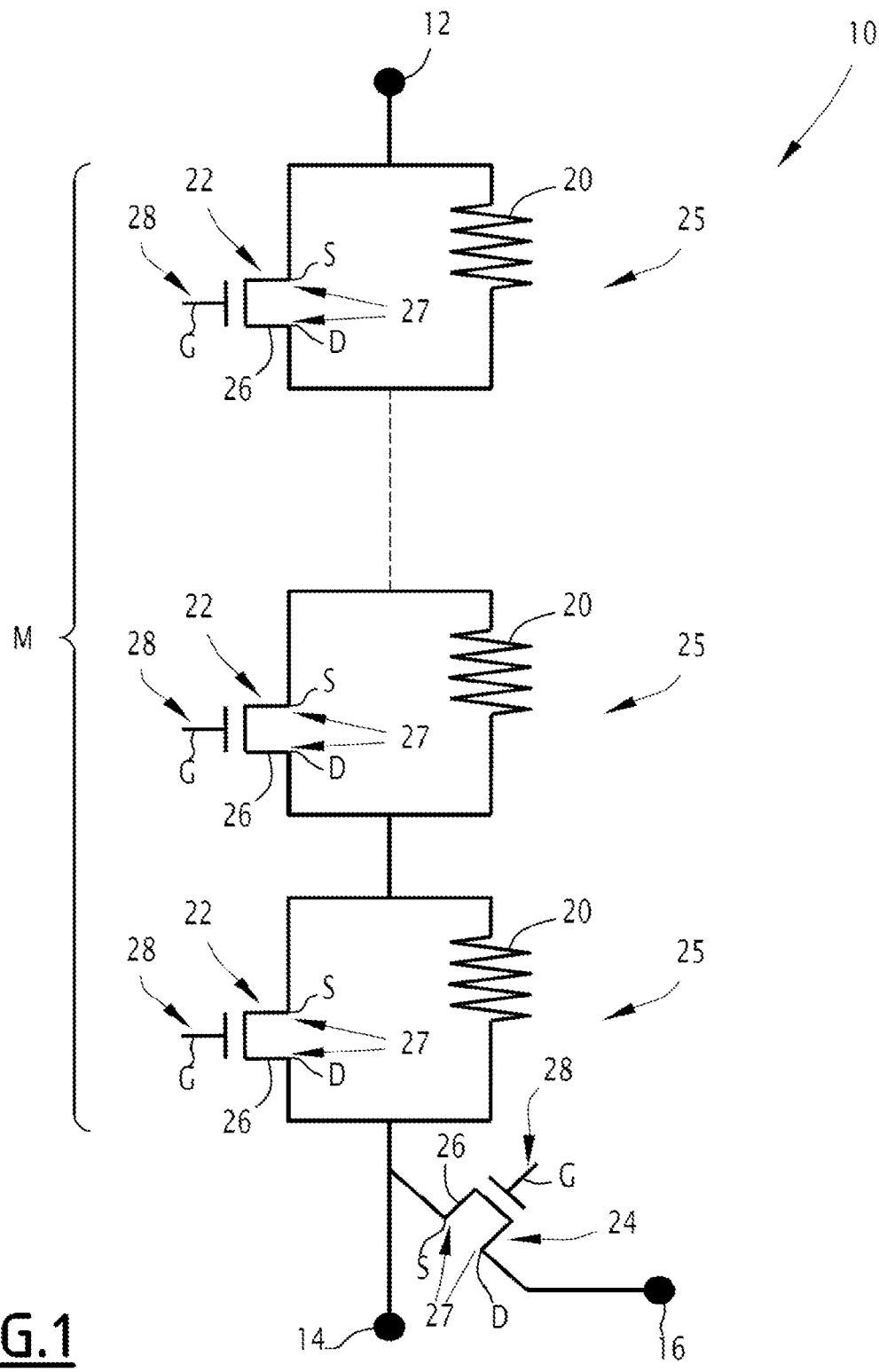
FIG. 1 is a schematic representation of a memory cell comprising two main terminals and an auxiliary terminal, M memristors and M primary switches connected between the two main terminals, each primary switch being connected in parallel with a respective memristor, as well as a secondary switch connected between the auxiliary terminal and one of the main terminals, in the case where M is strictly greater than 1, according to a first embodiment of the invention.

In FIG. 1, a memory cell 10 comprises a first main terminal 12, a second main terminal 14 and an auxiliary terminal 16.

The memory cell 10 comprises M memristor(s) 20 connected between the two main terminals 12, 14, M being an integer greater than or equal to 1; M primary switch(es) 22, each being connected in parallel to a respective memristor 20; and a secondary switch 24 connected between the second main terminal 14 and the auxiliary terminal 16. Each primary switch 10 forms with the respective memristor 20, in parallel with which it is connected, a sub-cell 25. In other words, the memory cell 10 comprises M sub-cells 25 connected in series with each other between the two main terminals 12, 14; and in addition, the secondary switch 24 connected between the second main terminal 14 and the auxiliary terminal 16.

The memory cell 10 is typically a resistive random access memory cell, also referred to as a RRAM cell or ReRAM cell.

The memory cell 10 is configured to write a respective value to at least one memristor via the opening of the or each primary switch 22 in parallel with said at least one memristor 20, closing the or each other possible primary switch 22, closing the secondary switch 24, and applying a corresponding programming voltage between the first main terminal 12 and the auxiliary terminal 16, that is, at the ends of the memristor 20.

The skilled person will then understand that this writing of value to at least one memristor 20 of the memory cell 10 corresponds to the assignment of a resistance value to said at least one memristor 20 by application of the programming voltage corresponding to said value at the ends of said at least one memristor 20.

The memory cell 10 is also configured to read a respective value in at least one memristor 20 via the opening of the or each primary switch 22 in parallel with said at least one memristor 20, closing the or each other possible primary switch 22, opening the secondary switch 24 and measuring a corresponding electrical quantity between the two main terminals 12, 14, that is at the ends of said at least one memristor 20.

The skilled person will then understand that this reading of the value contained in at least one memristor 20 of the memory cell 10 corresponds to the reading of the resistance value of said at least one memristor 20, via the measurement of the corresponding electrical quantity at the ends of said at least one memristor 20, for example via the measurement of the voltage at the ends of said at least one memristor 20.

As an optional addition, the memory cell 10 is further configured to multiply a value of the respective at least one memristor 20 by a multiple, via alternating opening and closing of the or each primary switch 22 in parallel with said at least one memristor 20 during an inference cycle, closing the or each other possible primary switch 22, opening the secondary switch 24 and measuring a corresponding electrical quantity between the two main terminals 12, 14. A ratio ρ between a cumulative duration of opening of the or each primary switch 22 in parallel with said at least one memristor 20 during the inference cycle and a duration of said cycle is representative of the respective multiple. The ratio ρ is equal to said multiple.

In the example of FIG. 1, the memory cell 10 comprises exactly M memristor(s) 20.

In the example of FIG. 1, the memory cell 10 comprises exactly M+1 switches 22, 24.

In the example of FIG. 1, the memory cell 10 is then constituted of the first and second main terminals 12, 14, the auxiliary terminal 16, the memristor 20, and the primary and secondary switches 22, 24.

In the example of FIG. 1, the memory cell 10 is therefore a (M+1)TMR type memory cell, referring to the presence of M+1 switches (denoted (M+1)T) and M memristor(s) (denoted MR), and each sub-cell 25 is of the 1T1 R type.

In the example of FIG. 1, the integer M is strictly greater than 1.

When the number M is strictly greater than 1, the skilled person will understand that the writing of a given value in a respective memristor 20 is obtained in particular via the opening of the primary switch 22 in parallel with said memristor 20, and the closing of the or the M−1 other primary switch(es) 22, which then corresponds to the case where the other possible primary switch(es) 22 are to be closed.

When the number M is alternatively equal to 1, as will be described in more detail below with respect to FIGS. 4 to 6, the skilled person will also understand that the writing of a given value in the memristor 20 of the memory cell 10 is obtained in particular via the opening of the primary switch 22 which is arranged in parallel with the said memristor 20, and that there is then no other possible primary switch 22 to be closed in this case.

The skilled person will then observe that the memory cell 10 according to the invention is a 2T1 R type cell in the case where M is equal to 1, and then includes one memristor less than the 2T2R type memory cell of the prior art.

The skilled person will note more generally that in the example of FIG. 1, for M greater than 1, the memory cell 10 of the type (M+1)TMR according to the invention allows to write the M distinct values, then to read and/or infer these values, each of the M sub-cells being associated with a respective value; and that the memory cell 10 is therefore comparable to the M memory cells of type 2T2R of the state of the art, each sub-cell 25 of type 1T1R according to the invention being comparable to the memory cell of type 2T2R of the state of the art. The skilled person will then understand that the memory cell 10 according to the first embodiment of the invention includes M fewer memristors, as well as (M−1) fewer switches than the M type 2T2R memory cells corresponding to the state of the art, or even that each type 1T1R sub-cell 25 according to the first embodiment includes one fewer memristor and one fewer switch than the type 2T2R memory cell of the state of the art.

Each memristor 20 is a passive electronic component the electrical resistance value of which changes, permanently, when a current is applied. In other words, each memristor is a resistive component, and more specifically a resistive memory component. Thus, data can be stored and rewritten by a control current. Such behavior is notably observed in phase change materials, ferroelectric tunnel junctions or oxide-based redox memories, such as HfOx or TiO2−x.

Each memristor 20 is a non-volatile memory component, the value of its electrical resistance changing with the application of a voltage for a certain period of time and remaining at that value in the absence of voltage.

The change in conductance of the memristor 20 depends on the magnitude and the duration of the voltage pulses applied across the memristor 20, as well as the maximum current value that can flow through the memristor 20, for example for a "SET" operation, that is, switching from a high resistance to a low resistance. A reverse "RESET" operation corresponds to switching from a low resistance to a high resistance.

The memristor 20 is likely to present two states, namely a high state and a low state.

The high state corresponds to a high resistance and is generally designated by the abbreviation HRS (High Resistive State). The high state is hereafter referred to as the HRS.

The low state corresponds to a low resistance and is generally designated by the abbreviation LRS (Low Resistive State) which literally means low resistive state. The low state is hereafter referred to as the LRS state.

The memristor 20 is, for example, a resistive memory component selected from among the group consisting of: a PCRAM component (Phase-Change Random Access Memory), an OxRAM component (hafnium-oxide RRAM, which is hafnium-oxide Resistive Random Access Memory), a MRAM component (Magnetic Random Access Memory), and a CBRAM component (Conductive Bridging Random Access Memory).

The skilled person will note that the PCRAM component is also known by the following equivalent names: PCM component (Phase Change Memory), PRAM component (Phase-change Random Access Memory), OUM component (Ovonic Unified Memory), and C-RAM or CRAM component (Chalcogenide Random Access Memory).

Each primary switch 22 is also referred to as a primary switch. Each primary switch 22 is, for example, realized in the form of a transistor 26.

The secondary switch 24 is similarly also referred to as a secondary switch. The secondary switch 24 is, for example, in the form of the transistor 26.

Each switch 22, 24 includes, as known per se, two conduction electrodes 27 and one control electrode 28.

The transistor 26 is typically a field effect transistor, also known as a FET (Field Effect Transistor). The field effect transistor is, for example, an insulated gate field effect transistor, also referred to as a MOSFET (Metal Oxide Semiconductor Field Effect Transistor). Alternatively, the field-effect transistor is a junction field-effect transistor, also called JFET (Junction Field Effect Transistor); a metal-gate field-effect transistor, also called MESFET (MEtal Semiconductor Field Effect Transistor); a high-electron-mobility field-effect transistor, also called MODFET (MOdulated-Doping Field Effect Transistor) or HEMT (High Electron Mobility Transistor); or an organic field effect transistor, also called OFET (Organic Field Effect Transistor); a CNFET transistor (Carbon Nanotube Field Effect Transistor); an EOSFET transistor (Electrolyte Oxide Semiconductor Field Effect Transistor); CMOS transistor (Complementary Metal Oxide Semiconductor); FDSOI transistor (Fully Depleted Silicon On Insulator); FinFET transistor (Fin Field-Effect Transistor); or ISFET transistor (Ion Sensitive Field Effect Transistor).

When the transistor 26 is a field-effect transistor, the conduction electrodes 27 are, as known per se, source S and drain D electrodes, with the control electrode 28 being a gate electrode G.

In the example of FIG. 1, the transistor 26 forming the primary switch 22 of a first sub-cell 25 connected directly to the first main terminal 12 is connected by its source electrode S to said first main terminal 12 and by its drain electrode D to the next sub-cell 25, in particular to the source electrode S of the transistor 26 forming the primary switch 22 of said next sub-cell 25. The transistor 26 forming the primary switch 22 of a respective sub-cell 25 of the series is connected by its source electrode S to the preceding sub-cell 25, in particular to the drain electrode D of the transistor 26 forming the primary switch 22 of said preceding sub-cell 25; and respectively by its drain electrode D to the following sub-cell 25, in particular to the source electrode S of the transistor 26 forming the primary switch 22 of said following sub-cell 25. The transistor 26 forming the primary switch 22 of the last sub-cell 25 connected directly to the second main terminal 14 is connected by its source electrode S to the preceding sub-cell 25, in particular to the drain electrode D of the transistor 26 forming the primary switch 22 of said preceding sub-cell 25; and respectively by its drain electrode D to the second main terminal 14. The transistor 26 forming the secondary switch 24 is connected by its source electrode S to the second main terminal 14 and by its drain electrode D to the auxiliary terminal 16.

Alternatively, the transistor 26 is a bipolar transistor; or an insulated gate bipolar transistor, also known as an IGBT (Insulated Gate Bipolar Transistor).

Figure 2:
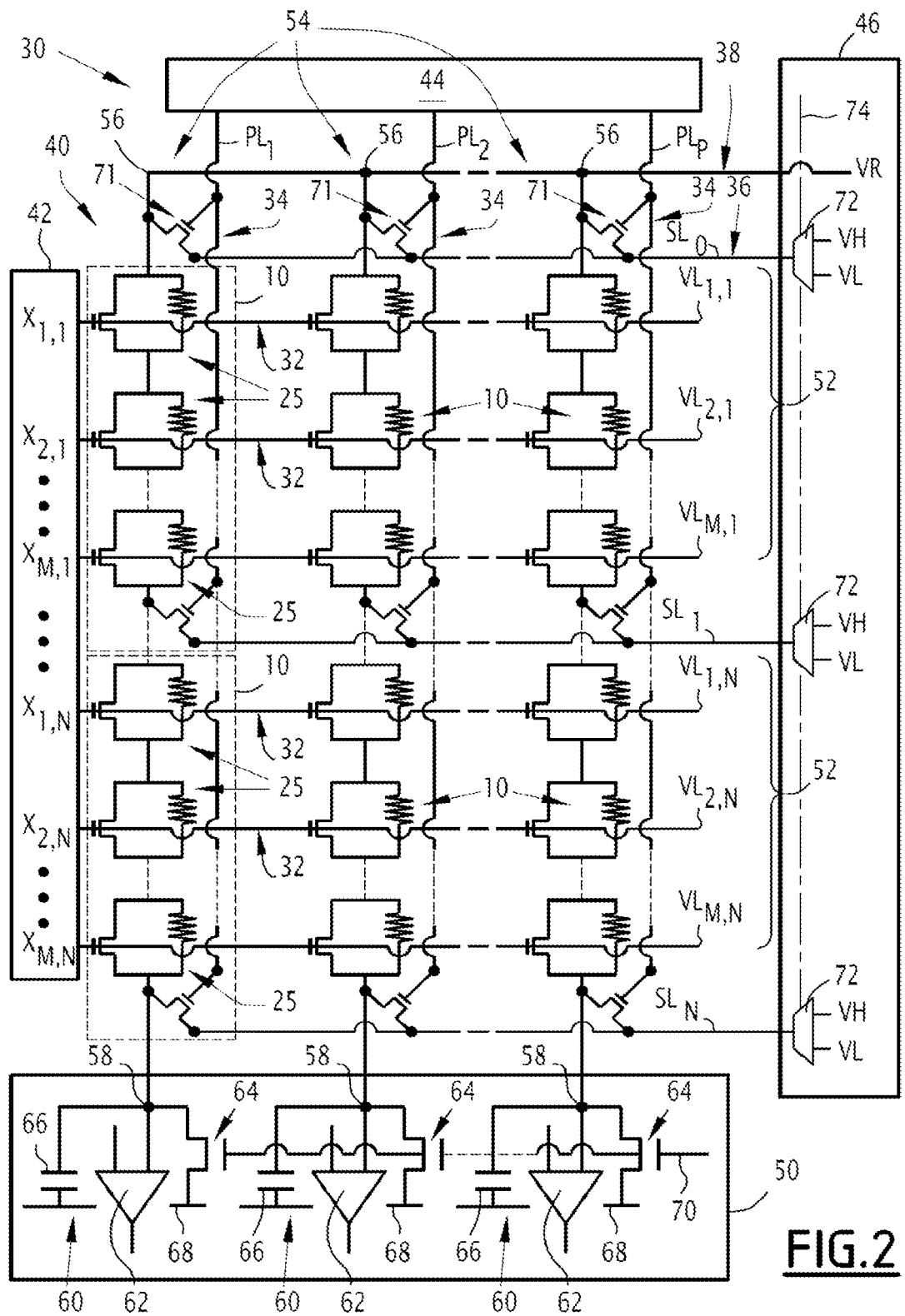
FIG. 2 is a schematic representation of an electronic circuit comprising value lines, programming lines, source lines and a set of memory cells, each of which is of the type of the memory cell of FIG. 1, according to a first embodiment.

In FIG. 2, an electronic circuit 30 comprises value lines 32, program lines 34, source lines 36; and a set 40 of memory cells 10, each memory cell 10 being as defined above.

For each memory cell 10, the control electrode 28 of each primary switch 22 is connected to a respective value line 32, the control electrode 28 of the secondary switch 24 is connected to a respective programming line 34, and the auxiliary terminal 16 is connected to a respective source line 36.

Additionally, the electronic circuit 30 comprises a reference line 38 to which a reference potential VR is applied.

Additionally, the electronic circuit 30 comprises a first controller 42, configured to control, that is, command or otherwise control, each of the value lines 32; a second controller 44 configured to control each of the programming lines 34; and a third controller 46 configured to control each of the source lines 36, as well, in addition, the reference line 38.

Also in addition, the electronic circuit 30 comprises a measurement device 50 configured to effect measurements representative of electrical quantities of the memory cells 10 of the set 40, such as voltages across the memristors 20 of said memory cells 10.

The set 40 of memory cells 10 is arranged so as to have one or more sub-sets of memory cells 10, where the memory cells 10 are connected in series with each other within each respective sub-set.

The set 40 of memory cells 10 is typically arranged as a matrix in the form of rows 52 and columns 54. According to this arrangement, each row 52 is preferably arranged horizontally, and each column 54 is preferably arranged vertically. The memory cells 10 in a single row 52 are, for example, connected to a single value line 32 and a single source line 36, and the memory cells 10 in a single column 54 are, for example, connected to a single programming line 34.

When the set 40 is arranged in matrix form, the number of rows 52 is preferably substantially equal to the number of columns 54.

According to this arrangement, the memory cells 10 in a single column 54 are connected in series with each other, each column 54 including a first end 56 connected to the reference potential VR and a second end 58 connected to a respective measurement module 60. Each measurement module 60 is configured to measure a cumulative voltage of the memory cells 10 in the column 54 to which it is connected.

According to this arrangement, each second main terminal 14 of a given memory cell of a respective column 54 is then connected to the first main terminal 12 of a next memory cell 10 of said column 54, the second main terminal 14 of a last memory cell of said column 54 being connected to a respective measurement module 60, and the first main terminal 12 of a first memory cell 10 of said column 54 then being connected to the reference line 38.

According to this arrangement, the measurement device 50 includes the measurement modules 60. The measurement device 50 typically includes a respective measurement module 60 for each of the columns 54.

Each measurement module 60 includes, for example, a comparator 62 configured to detect when the cumulative voltage of the memory cells 10 of the respective column 54 reaches a respective predefined threshold voltage Uth.

Additionally, each measurement module 60 includes a reset switch 64 and a capacitor 66. The capacitor 66 is configured, on the one hand, to be charged by the accumulated voltage of the memory cells 10 of the respective column 54 during a measurement phase, the reset switch 64 being open at the time; and, on the other hand, to be discharged by connecting to an electrical ground 68 via the closing of the reset switch 64 during a reset phase.

In addition, the measurement device 50 comprises a measurement line 70 connected to each of the reset switches 64, in particular to their control electrode, to allow simultaneous control of the reset switches 64, and then simultaneous control of the various measurement modules 60.

The value lines 32 are also denoted $VL_{i,k}$ with i an integer index ranging from 1 to M where M represents the number of memristors 20 in each memory cell 10, which is equal to the number of primary switches 22 in each memory cell 10, M then also representing the number of primary switches 22 within each memory cell 10; and k an integer index ranging from 1 to N, where N represents the number of rows 52. More specifically, the value lines 32 are then denoted $VL_{1,1}$, $VL_{2,1}, \ldots, VL_{M,1}$ for the first row 52 with index k equal to 1; then $VL_{1,2}, VL_{2,2}, \ldots, VL_{M,2}$ for the second row 52 with index k equal to 2; to $VL_{1,N}, VL_{2,N}, VL_{M,N}$ for the last row 52 with index k equal to N.

The set 40 typically comprises between 32 and 2000 sub-cells 25, and preferably from a few hundred to about 1000 sub-cells 25.

The number M of sub-cells 25 per memory cell 10 is typically between a few units and a few tens.

The programming lines 34 are also noted as $PL_j$, where j is an integer index ranging from 1 to P, where P represents the number of columns 54. The programming lines 34 are then denoted $PL_1, PL_2, PL_P$.

The source lines 36 are also denoted $SL_k$, with k being the integer index ranging from 1 to N, where N represents the number of rows 52. The source lines 36 are then denoted $SL_1, SL_2, SL_N$.

As an addition, the electronic circuit 30 comprises an additional source line 36, noted $SL_0$, allowing to apply a predefined potential to the first main terminals 12 of the memory cells 10 of the first row of the set 40 during their programming.

According to this addition, the electronic circuit 30 further comprises a head switch 71 for each column 54, each respective head switch 71 being connected between the first main terminal 12 of the respective memory cell 10 of the first row and the additional source line 36 $SL_0$ According to this addition, the conduction electrodes 27 of the head switch 71 are then connected to the respective first main terminal 12 on the one hand and to the additional source line $SL_0$ on the other hand, and the control electrode 28 of the head switch 71 is connected to a respective programming line 34. In the example of FIG. 2, each head switch 71 is realized in the form of the transistor 26, the latter preferably being a field effect transistor, and is connected by its drain electrode D to the additional source line $SL_0$, by its source electrode S to the respective first main terminal 12, and by its gate electrode G to the respective programming line 34.

The reference line 38 is configured to charge the capacitor 66 of each measurement module 60 during the measurement phase, by applying the reference potential VR across the measurement cells 10 of a respective column 54 to the capacitor 66.

Figure 8:
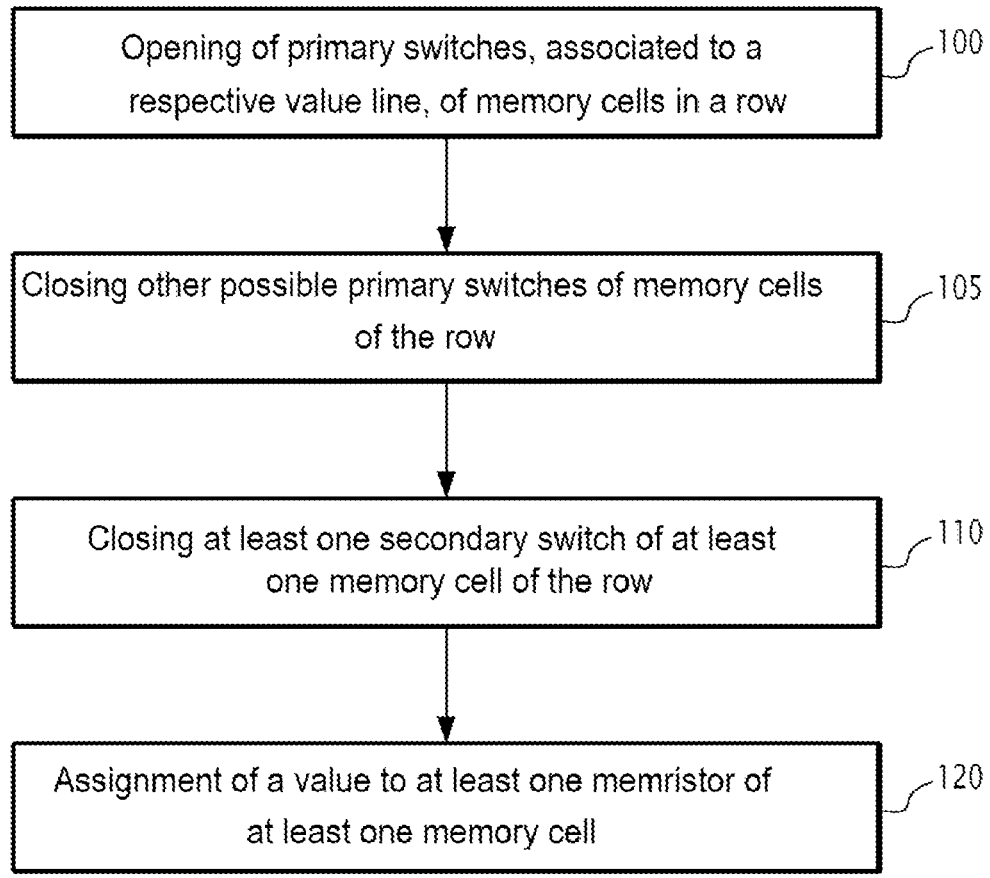
FIG. 8 is a flow chart of a method for programming at least one memory cell of a respective row of memory cells of the electronic circuit, according to the first embodiment of the invention.
Figure 9:
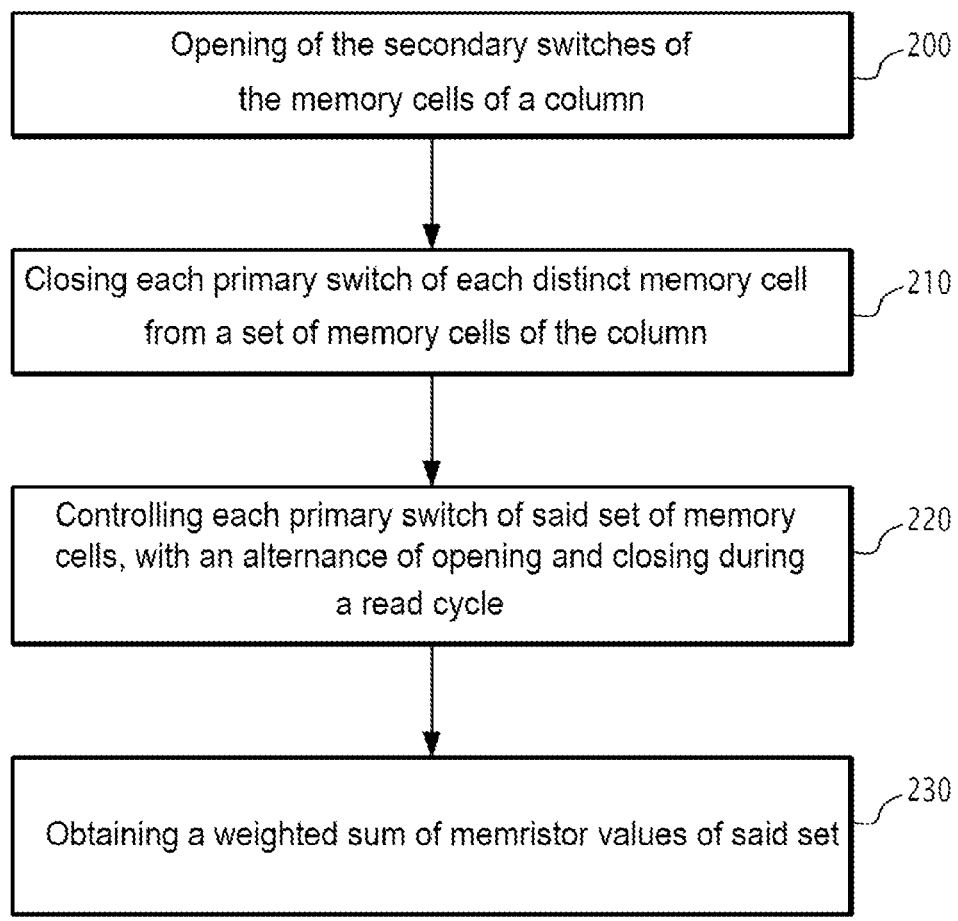
FIG. 9 is a flowchart of a method for multiplying and accumulating a set of memory cells of a respective column of memory cells of the electronic circuit, according to the first embodiment of the invention.

The first controller 42 is configured to control each of the value lines 32 connected to the control electrodes 28 of the primary switches 22 of the memory cell set 40, depending on the operation effected on the memory cells 10, in particular among a programming operation, that is, a write operation, when the programming method according to the invention is implemented; and respectively an inference operation when the multiplication and accumulation method according to the invention is implemented; as will be described in more detail hereafter with respect to FIG. 8, and respectively to FIG. 9; as well as a read operation when the read method according to the invention is implemented.

The first controller 42 is for example configured to control the primary switches 22 of a respective row 52, when programming memory cell(s) 10 of said row 52, in particular opening the primary switches 22 connected to a respective value line 32 associated with said row and closing any possible other possible primary switches 22 of the memory cells of said row 52, these other possible primary switches 22 then being connected to value lines 32 other than the one to which an opening signal is applied.

The first controller 42 is, for example, configured to control alternating opening(s) and closing(s) of primary switches 22 of a respective column 54, when implementing an inference operation with a set of memory cells 10 of said column 54.

When the multiply-and-accumulate method according to the invention is implemented, the first controller 42 is typically configured to control each primary switch 22 of said set of memory cells with alternating opening(s) and closing(s) during an inference cycle, via the application of the alternating open and close commands on each value line 32 connected to each primary switch 22 of said set, to multiply the value of each memristor 20 of said set by a respective multiple. The ratio ρ between the cumulative open duration of the respective primary switch 22 during the inference cycle and the duration of said cycle represents the respective multiple.

The respective multiple for each value line 32 is denoted $X_{i,k}$, with i the integer index ranging from 1 to M and k the integer index ranging from 1 to N, where M represents the number of primary switches 22 per memory cell 10 and N represents the number of rows 52. The respective multiple $X_{i,k}$ is equal to said ratio ρ, as will be described in more detail subsequently with reference to FIG. 9 and the associated flowchart of the multiply-and-accumulate method according to the invention. In a similar manner to what was previously described for the value lines 32, the multiples are then denoted $X_{1,1}, X_{2,1}, \ldots, X_{M,1}$ for the first row 52 with index k equal to 1; then $X_{1,2}, X_{2,2}, \ldots, X_{M,2}$ for the second row 52 with index k equal to 2; up to $X_{1,N}, X_{2,N}, X_{M,N}$ for the last row 52 with index k equal to N. The second controller 44 is configured to control each of the programming lines 34 connected to the control electrodes 28 of the secondary switches 24 of the memory cell set 40, and in addition to the head switches 71, as a function of the operation performed on the memory cells 10, in particular among the aforementioned programming operation, inference operation and read operation.

The second controller 44 is, for example, configured to control the closing of the secondary switch 24 of each memory cell 10 to be programmed, when programming memory cells 10 of a respective row 52.

The second controller 44 is for example configured to control the opening of the secondary switches 24 of the memory cells 10 of a respective column 54, when implementing the inference operation with the set of memory cells 10 of said column 54. The second controller 44 is preferably configured to control the opening of all the secondary switches 24 of the set 40 of memory cells during said inference operation.

The third controller 46 is configured to control each of the source lines 36 connected to the respective conduction electrodes 27 of the secondary switches 24 of the set 40 of memory cells, depending on the operation performed on the memory cells 10, including the aforementioned programming operation, inference operation and read operation.

During the programming operation, in order to assign a respective value to each of the memristors 20 of each memory cell 10 to be programmed, the third controller 46 is for example configured to impose a programming voltage corresponding to said value between the first main terminal 12 and the auxiliary terminal 16 of each memory cell 10 to be programmed, by applying a first electric potential V1 to the source line(s) 36 arranged on the side of said first main terminal 12 and a second electric potential V2 to the other source line(s) 36, arranged on the side of said auxiliary terminal 16. The programming voltage corresponding to the assigned value is equal to the difference between the first V1 and second V2 potentials. During this programming operation, the primary switch 22 connected in parallel to the memristor 20—to which the respective value is assigned—is additionally open, while the other primary switches 22 of the respective memory cell 10 are closed, this by the first controller 42.

The third controller 46 includes, for example, multiplexers 72 and a selection bus 74 connected to the multiplexers 72, each source line 36 being connected to a respective multiplexer 72. According to this example, each multiplexer 72 is then configured to select, as a function of a respective selection signal applied to the selection bus 74 and from among a plurality of predefined values VH, VL, an electric potential value to be applied to the associated source line 36. The predefined values VH, VL typically correspond to the possible values of the aforementioned first V1 and second V2 potentials, the difference of which is equal to the programming voltage to be imposed between the first main terminal 12 and the auxiliary terminal 16 of the memory cell 10 for assigning the respective desired value to each of the memristors 20 of that memory cell 10 to be programmed.

During the inference operation, or even during the read operation, the third controller 46 is, for example, configured to apply a default potential to the various source lines 36, the secondary switches 24 being open during the inference operation, or even during the read operation, and these source lines 36 then not being used.

Additionally, the third controller 46 is configured to apply the reference potential VR to the reference line 38.

In the example shown in FIG. 2, the first controller 42, the second controller 44, and the third controller 46 are realized in the form of controllers distinct from each other. Alternatively, at least two of the three aforementioned controllers 42, 44, 46, or even all three controllers 42, 44, 46 are combined into a single controller then configured to control several types of line, or all types of lines, from among the value lines 32, programming lines 34, and source lines 36, as well as additionally the reference line 38.

Figure 3:
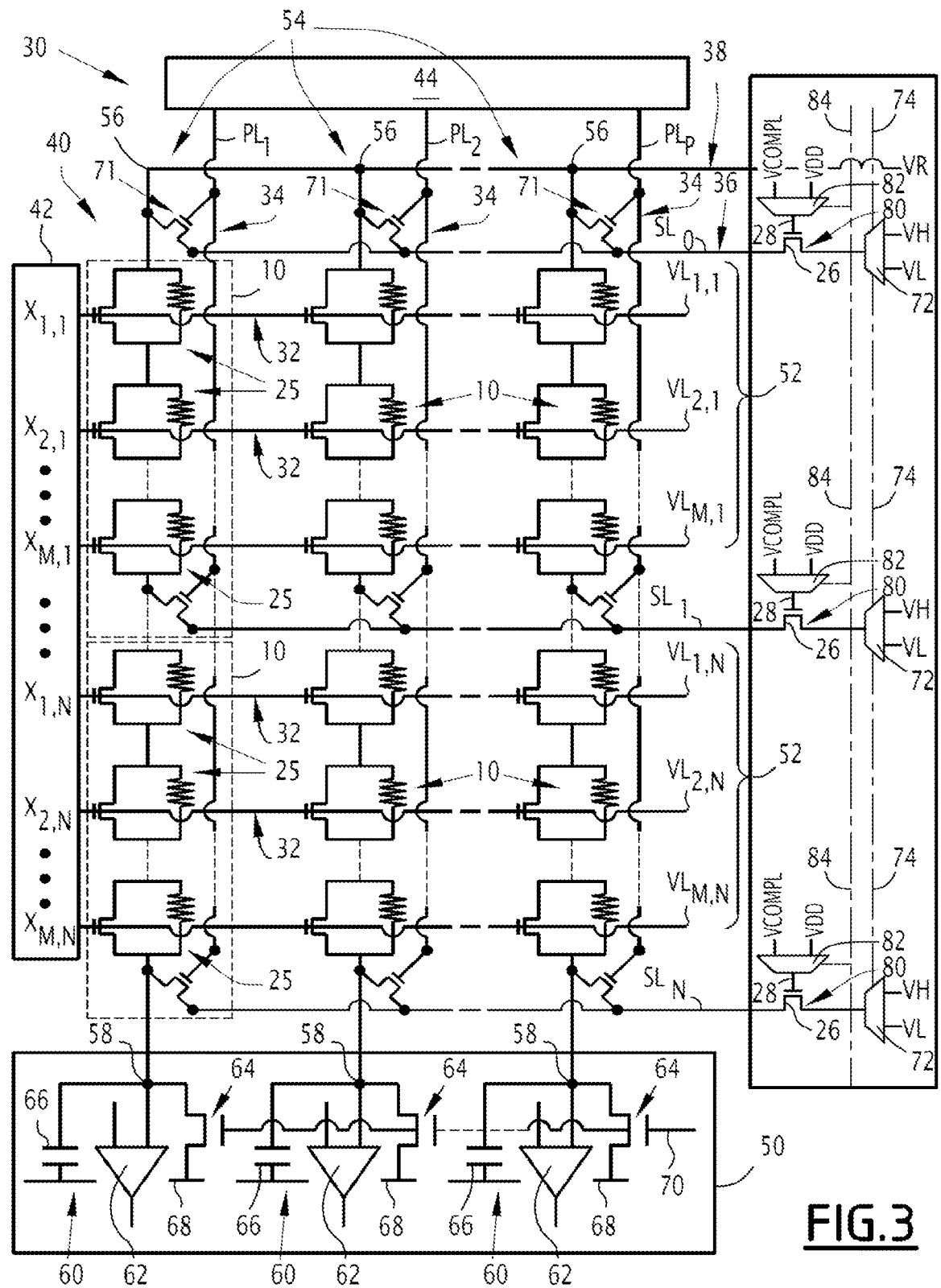
FIG. 3 is a view similar to FIG. 2, according to a second embodiment, where the electronic circuit further comprises, auxiliary switches connected to the source lines.

FIG. 3 illustrates one alternative embodiment of the electronic circuit 30 of FIG. 2, in which the elements common to the electronic circuit 30 of FIG. 2 are marked by identical references and are not described again.

According to this alternative embodiment, the electronic circuit 30 further comprises auxiliary switches 80, with each source line 36 being connected to a respective auxiliary switch 80.

Each auxiliary switch 80 is configured to, upon receipt of a limitation command, limit an electrical current flowing in the associated source line 36. This limitation of the electrical current in the associated source line 36 is typically implemented during a programming operation, in order to limit the current in the at least one memory cell 10 to be programmed, and in particular in the or the associated memristor(s) 20.

Each auxiliary switch 80 is also referred to as an auxiliary switch. Each auxiliary switch 80 is, for example, realized in the form of the transistor 26, the transistor 26 then preferably being a field effect transistor. The limitation command is then typically a predefined limiting potential VCOMPL applied to the control electrode 28 of said auxiliary switch 80.

As known per se, the current flowing through the field effect transistor between the conduction electrodes 27 is—in the saturation regime of the field effect transistor, in particular of the MOSFET—limited to a maximum value depending on a voltage VGS between the source electrode S and the gate electrode G, and the lower the voltage VGS, the more said maximum current value is lower.

According to this alternative embodiment, the skilled person will then understand that the limitation of the current flowing through the corresponding source line 36 is obtained by applying to the control electrode 28 of the auxiliary switch 80 the predefined limiting potential VCOMPL, of a value lower than that of a default potential VDD, the default potential VDD corresponding to an absence of current limitation.

Each auxiliary switch 80 is typically connected between one end of the respective source line 36 and a respective multiplexer 72. In other words, each auxiliary switch 80 is arranged between the set 40 of memory cells and a respective multiplexer 72. Each auxiliary switch 80 is preferably included in the third controller 46.

According to this alternative embodiment, and as an optional addition, the electronic circuit 30 further comprises auxiliary multiplexers 82 and an auxiliary select bus 84 connected to the auxiliary multiplexers 82. The control electrode 28 of each auxiliary switch 80 is then connected to a respective auxiliary multiplexer 82, each auxiliary multiplexer 82 being configured to select—as a function of a limit signal and from among several predefined values, such as the value of the predefined limiting potential VCOMPL and that of the default potential VDD—a value of electric potential to be applied to the associated control electrode 28.

Figure 4:
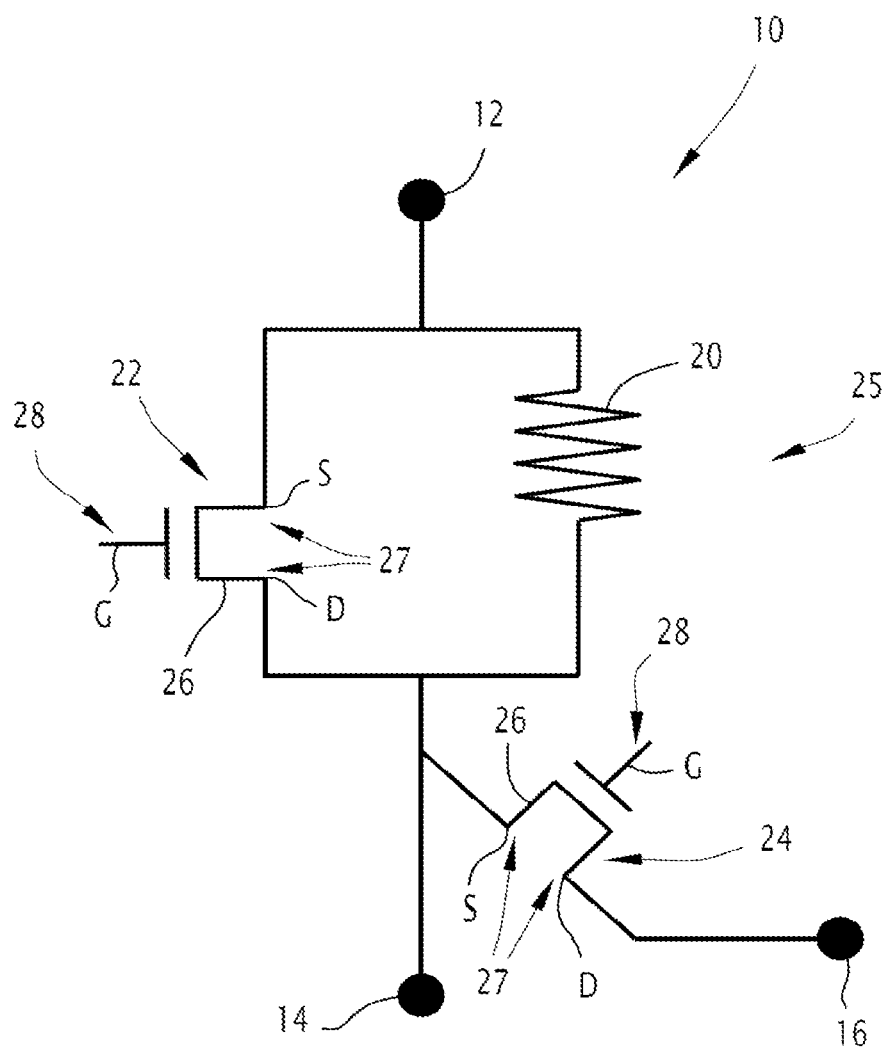
FIG. 4 is a view similar to that of FIG. 1, in the case where M is equal to 1.
Figure 5:
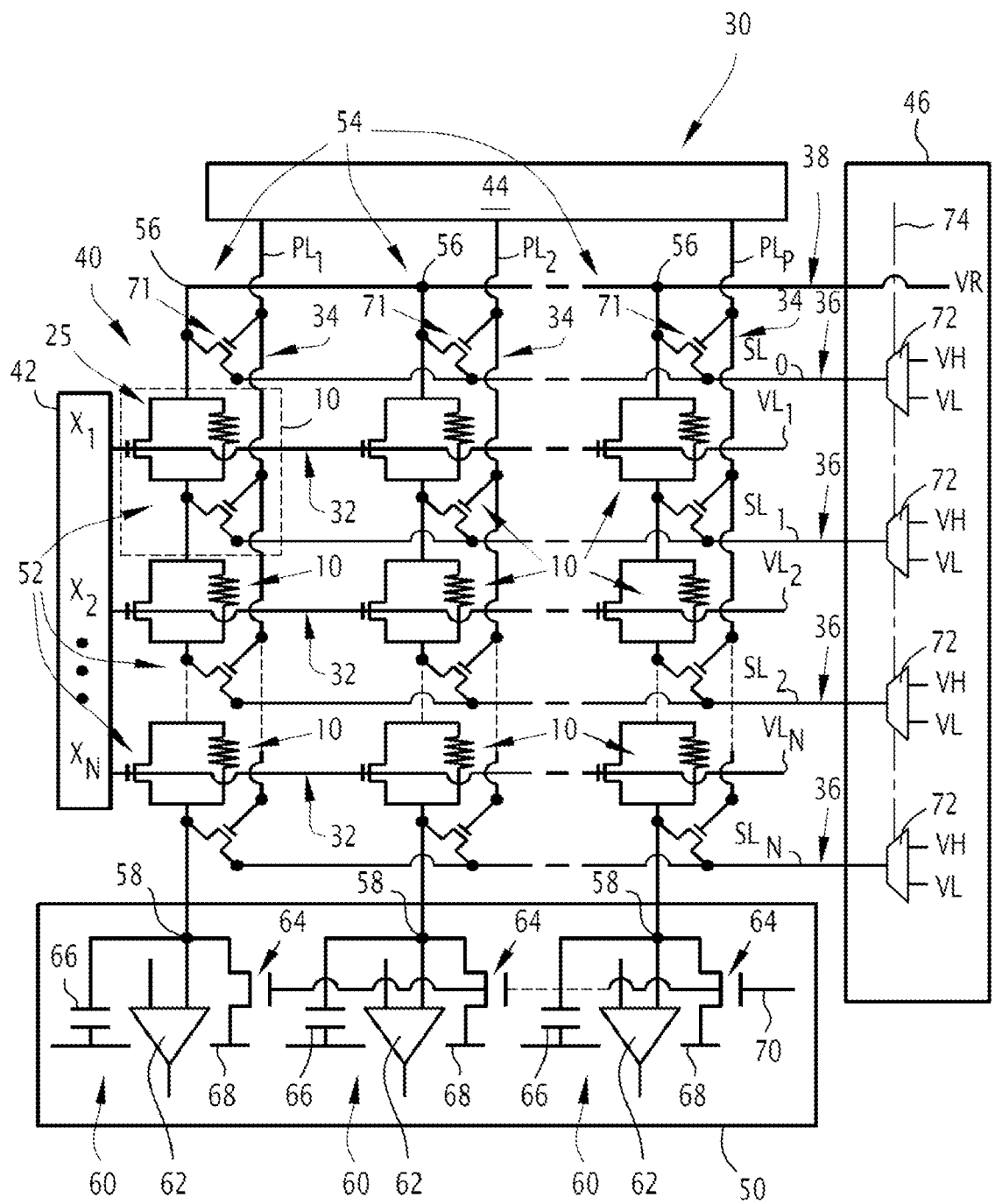
FIG. 5 is a view similar to that of FIG. 2, where M is equal to 1.
Figure 6:
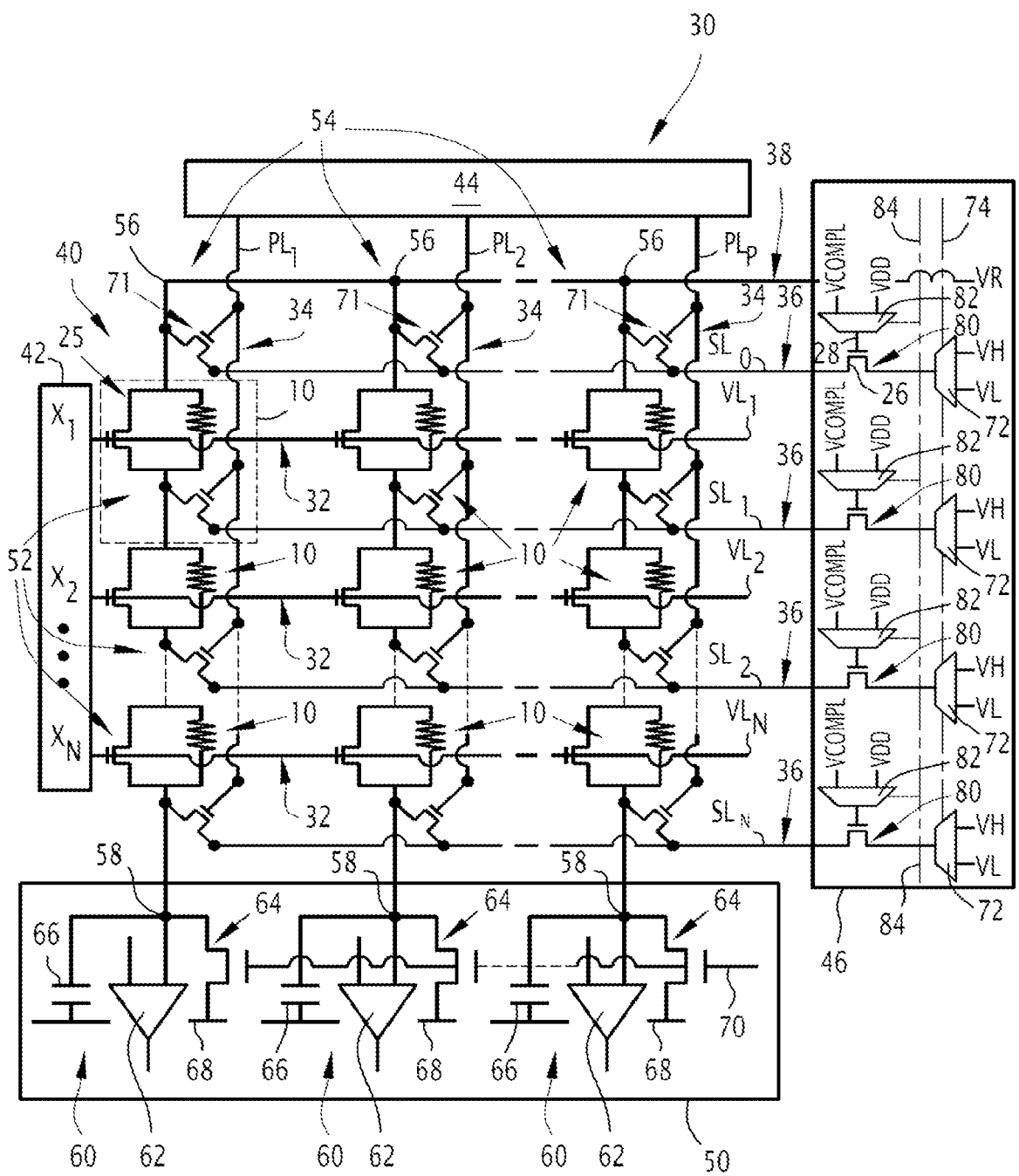
FIG. 6 is a view similar to that of FIG. 3, in the case where M is equal to 1.

FIGS. 4 to 6 illustrate the particular case of the first embodiment where the number M of memristors 20 per memory cell 10 is equal to 1, for which the elements similar to those of the general case described above (where the number M is greater than or equal to 1, and in particular strictly greater than 1) are marked by identical references, and are not described again.

In the example shown in FIG. 4, the memory cell 10 comprises the memristor 20 connected between the two main terminals 12, 14; the primary switch 22 connected between the two main terminals 12, 14, in parallel with the memristor 20; and the secondary switch 24 connected between the second main terminal 14 and the auxiliary terminal 16.

In this example, the memory cell 10 then comprises a single memristor 20. The memory cell 10 comprises exactly two switches 22, 24. In other words, the memory cell 10 comprises a single sub-cell 25.

In the example shown in FIG. 4, the memory cell 10 then constitutes the first and second main terminals 12, 14, of the auxiliary terminal 16, the memristor 20, and the primary and secondary switches 22, 24.

In this example, the memory cell 10 is thus a 2T1 R type memory cell, in reference to the presence of two switches (designation 2T) and a single memristor (designation 1R).

The skilled person will then observe that the memory cell 10 in the example of FIG. 4 includes one less memristor than the 2T2R type memory cell of the state of the art.

In the example of FIG. 4, the transistor 26 forming the primary switch 22 is then connected by its source electrode S to the first main terminal 12 and by its drain electrode D to the second main terminal 14. The transistor 26 forming the secondary switch 24 is connected by its source electrode S to the second main terminal 14 and by its drain electrode D to the auxiliary terminal 16.

In the example of FIG. 5, the electronic circuit 30 is similar to that of FIG. 2 by then having the number M equal to 1, and also comprises the value lines 32, the programming lines 34, the source lines 36 and the set 40 of memory cells 10, each memory cell 10 being as shown in FIG. 4.

In this example of FIG. 5, the number M being equal to 1, the index i is not required. The value lines 32 are also denoted $VL_k$ with k the integer index varying from 1 to N, where N represents the number of rows 52. More specifically, the value lines 32 are then denoted $VL_1$, $VL_2$, ..., $VL_N$.

In the example of FIG. 5, the set 40 typically comprises between 32 and 2000 memory cells 10, and preferably from a few hundred to about 1000 memory cells 10.

The programming rows 34 are also noted as $PL_j$, with j the integer index ranging from 1 to P, where P represents the number of columns 54. The programming lines 34 are then denoted $PL_1$, $PL_2$, $PL_P$.

The source lines 36 are also denoted $SL_k$, with k the integer index ranging from 1 to N, where N represents the number of rows 52. The source lines 36 are then denoted $SL_1$, $SL_2$, $SL_N$.

In addition, the electronic circuit 30 comprises the additional source line 36, noted $SL_0$, allowing to apply the predefined potential to the first main terminals 12 of the memory cells 10 of the first row of the set 40 during their programming.

In the example of FIG. 5, in addition, the electronic circuit 30 comprises the reference line 38 to which the reference potential VR is applied.

Additionally, the electronic circuit 30 comprises the first controller 42, the second controller 44, and the third controller 46. Furthermore, the electronic circuit 30 comprises the measurement device 50.

The respective multiple for each value line 32 is also denoted $X_k$, with k the integer index varying from 1 to N. in a manner similar to what was described above for the value lines 32, the multiples are then denoted $X_1$, $X_2$, ..., $X_N$.

FIG. 6 illustrates an alternative embodiment of the electronic circuit 30 of FIG. 5, for which the elements in common with the electronic circuit 30 of FIG. 5 are marked by identical references and are not described again.

This alternative embodiment is similar to the alternative embodiment of the electronic circuit 30 of FIG. 3 relative to that of FIG. 2. According to this alternative embodiment, the electronic circuit 30 then further comprises the auxiliary switches 80, each source line 36 being connected to a respective auxiliary switch 80.

According to this alternative embodiment, and as an optional addition, the electronic circuit 30 further comprises the auxiliary multiplexers 82 and the auxiliary selection bus 84 connected to the auxiliary multiplexers 82.

The operation of the memory cell 10 according to the invention, as well as the electronic circuit 30, will now be described with reference to FIG. 8 representing a flowchart of the method, according to the invention, of programming at least one memory cell 10 of a respective row 52 of memory cells 10 of the electronic circuit 30; then with reference to FIG. 9 representing a flowchart of the method, according to the invention, of multiplying and accumulating a set of memory cell(s) 10 of a respective column 54 of memory cells 10 of the electronic circuit 30.

In FIG. 8, the programming method comprises, during an initial step 100, opening the primary switches 22 of the memory cells 10 of the row 52 being the object of this programming, via the application of an open command on a respective value line 32 connected to said row 52.

During this opening step 100, the first controller 42 then controls the opening of the primary switches 22 connected by their control electrode 28 to that respective value line 32 of said row 52.

The skilled person will then understand that the respective value line 32, to which the open signal is applied, is that associated with the memristor 20 which is to be programmed from among the or the memristor(s) 20 of each memory cell 10 of said row 52. Indeed, for the programming of a respective memristor 20, the primary switch 22 connected in parallel thereto must be open, so that said memristor 20 is not short-circuited and can have a potential difference at its ends.

The method then comprises, during a subsequent step 105, closing the other possible primary switches 22 of the memory cells 10 of said row 52, via the application of a close command to the other possible value line(s) 32 connected to said row 52.

As previously explained, the case of these other possible primary switches 22 to be closed depends on the value of the number M.

When the number M is strictly greater than 1, the writing of a given value to a respective memristor 20 is obtained in particular via the opening 100 of the primary switch 22 in parallel with said memristor 20, and the closing 105 of the or the M−1 other primary switch(es) 22, which then corresponds to the case where the other possible primary switch(es) 22 are to be closed.

Alternatively, when the number M is equal to 1, the writing of a given value to the memristor 20 of the memory cell 10 is obtained in particular via the opening 100 of the primary switch 22 which is arranged in parallel with the said memristor 20, and there is then no other possible primary switch 22 to be closed in this case. In other words, the skilled person will understand that when the number M is equal to 1, the closing step 105 is not effected, as no other possible primary switch 22 has to be closed.

The programming method then comprises, during step 110, closing the at least one secondary switch 24 of said at least one memory cell 10, via the application of a close command on the at least one programming line 34 connected to said at least one memory cell 10 of said row 52.

During this closing step 110, the second controller 44 then commands the closing of the secondary switch 24 of each memory cell 10 to be programmed within said row 52.

Upon completion of the opening 100 of the primary switches 22, the closing 105 of the or the other possible primary switch(es) 22, if any, and the closing 110 of the at least one secondary switch 24, the method comprises, during the next step 120, assigning a value to the at least one memristor 20 of said at least one memory cell 10, with a programming voltage corresponding to the value between the at least one first main terminal 12 and the at least one auxiliary terminal 16 of said at least one memory cell 10.

During this assignment step 120, the third controller 46 then applies the first electric potential V1 to the source line(s) 36 arranged on the side of the at least one first main terminal 12, and respectively the second electric potential V2 to the other source line(s) 36, arranged on the side of the at least one auxiliary terminal 16, the programming voltage corresponding to the assigned value being equal to the difference between the first V1 and the second V2 potential.

The skilled person will then understand that to assign the low LRS state to the memristor(s) 20 that are programmed, this assignment of the low LRS state corresponding to the SET operation, the third controller 46 selects a higher value, such as the value VH, for the first potential than that selected for the second potential, such as the value VL, with VH greater than VL by convention, the voltage applied to the memristor(s) 20 then being equal to VH-VL.

Conversely, to assign the high HRS state to the memristor(s) 20 that are programmed, this assignment of the high HRS state corresponding to the RESET operation, the third controller 46 selects a lower value, such as the value VL, for the first potential than that selected for the second potential, such as the value VH, with VH>VL, the voltage applied to the memristor(s) 20 then being equal to VL-VH.

For programming each memristor 20, the programming voltage is typically equal to about 2 volts, and the VH value is for example equal to about 2 volts, while the VL value is substantially zero.

For reading each memristor 20, the read voltage is lower and typically between about 0.1 and 0.4 volts, and the VH value is for example between about 0.1 and 0.4 volts, while the VL value is substantially zero.

Again, by convention, a lower resistance of the memristor 20 corresponding to its low LRS state is associated with a lower value than that associated with a higher resistance of the memristor 20 corresponding to its high HRS state. As an example, the low LRS state of the memristor 20 corresponds to a low weight, that is, a logic "0"; and the high HRS state of the memristor 20 corresponds to a high weight, that is, a logic "1".

Additionally, a plurality of distinct levels of the low LRS state and/or the high HRS state are used, in order to have more than two possible programming values for the memristor 20. The plurality of distinct levels is preferably associated with the low LRS state, as this is more easily controlled than the high HRS state.

The skilled person will then understand that in order to assign, via the SET operation, the low LRS state to one of the memristors 20 of the memory cell 10 framed in the dotted line of the row 52 with an index equal to 1 in the example of FIG. 2 or to the memristor 20 of the memory cell 10 framed in the dotted line in the example of FIG. 5, the value of the first potential equal to VH is applied to the additional source line $SL_0$, while the value of the second potential equal to VL is applied to the source lines $SL_1$, $SL_2$, ... $SL_N$. Conversely, in this example of FIG. 2 or FIG. 5, to assign, via the RESET operation, the high HRS state to the aforementioned memristor 20, the value of the first potential applied to the additional source line $SL_0$ is equal to VL, while the value of the second potential applied to the source lines $SL_1$, $SL_2$, ..., $SL_N$ is equal to VH.

As described above, this setting of the potential of each of the source lines 36 to either value is typically accomplished by controlling the multiplexers 72 correspondingly via the setting of a respective message on the selection bus 74. As an example, assuming that a bit of value 1 controls the selection of the value VH by the multiplexer 72, and respectively that a bit of value 0 controls the selection of the value VL by said multiplexer 72, and further that—for the message applied on the selection bus 74—the first bit of the message is associated with the first multiplexer, by convention the one associated with the additional source line $SL_0$, and respectively the last bit of the message is associated with the last multiplexer, by convention the one associated with the source line $SL_N$, then the low LRS state is assigned, via the operation SET, to the memristor 20 mentioned in FIG. 2 or 5 by setting the message (1000) on the selection bus 74; and conversely, the high HRS state is assigned, via the operation RESET, to this memristor 20 by setting the message (0111) on said selection bus 74.

As an optional addition, when the electronic circuit 30 further includes the auxiliary switches 80, the third controller 46 further controls, during this assignment step 120, the closing of the auxiliary switches 80 connected to the source lines 36 to which one of the first V1 and second V2 potentials is applied. The auxiliary switch 80 associated with the row 52 being programmed, that is, the auxiliary switch 80 connected to the source line 36 which is itself connected to the at least one auxiliary terminal 16 of said row 52, is preferably further controlled with the predefined limiting potential VCOMPL applied to its control electrode 28, in order to limit the current flowing through each memristor 20 during its programming.

Alternatively, when the electronic circuit 30 does not include the auxiliary switches 80, the secondary switch 24 of each memory cell 10 to be programmed is preferably further controlled with the predefined limiting potential VCOMPL applied to its control electrode 28, in order to limit the current flowing through each memristor 20 during its programming. According to this alternative, the second controller 44 then controls, during the closing step 110, the closing of the secondary switch 24 of each memory cell 10 to be programmed, with the predefined limiting potential VCOMPL.

In FIG. 9, the multiply-and-accumulate method comprises, during an initial step 200, the opening of the secondary switches 24 of the memory cells 10 of the column 54 being the object of this multiply-and-accumulate, via the application of an open command on the programming line 34 connected to said column 54.

During this opening step 200, the second controller 44 then controls the opening of the secondary switches 24 of the memory cells 10 of said column 54.

During this opening step 200, the second controller 44 preferably further controls the opening of all secondary switches 24 of the electronic circuit 30. The skilled person will indeed understand that the source lines 36 are used for programming the memory cells 10, or even for reading these memory cells 10 independently of each other and are not used during the inference of the memory cells 10, and in particular during multiply-and-accumulate. The opening of all the secondary switches 24 then allows to isolate the set 40 of memory cells 10 relative to these source lines 36 during the reading of the memory cells 10.

If the set of memory cell(s) 10 being the object of this multiply-and-accumulate does not include all of the memory cells 10 in the corresponding column 54, then the multiply and accumulate method further comprises, during a step 210, closing each primary switch 22 of each distinct memory cell 10 of said set within the column 54, via the application of a close command to each value line 32 connected to each distinct memory cell 10 of said set. In other words, during this closing step 210, each primary switch 22 of each memory cell 10 that is not included in said set, while within said column 54, is closed.

During this closing step 210, the first controller 42 then controls the closing of each primary switch 22 for each memory cell 10 in said column 54 and which is not included in the set of memory cell(s) 10 being multiplied and accumulated.

Upon completion of the opening of the secondary switches 24 and the closing of each primary switch 22 of each memory cell 10 that is not included in said set being the object of the multiply and accumulate, the method comprises, in the next step 220, the controlling of each primary switch 22 of said set of memory cell(s) 10 with alternating open and close during an inference cycle, via the application of alternating open and close commands on each value line 32 connected to each primary switch 22 of said set.

Figure 7:
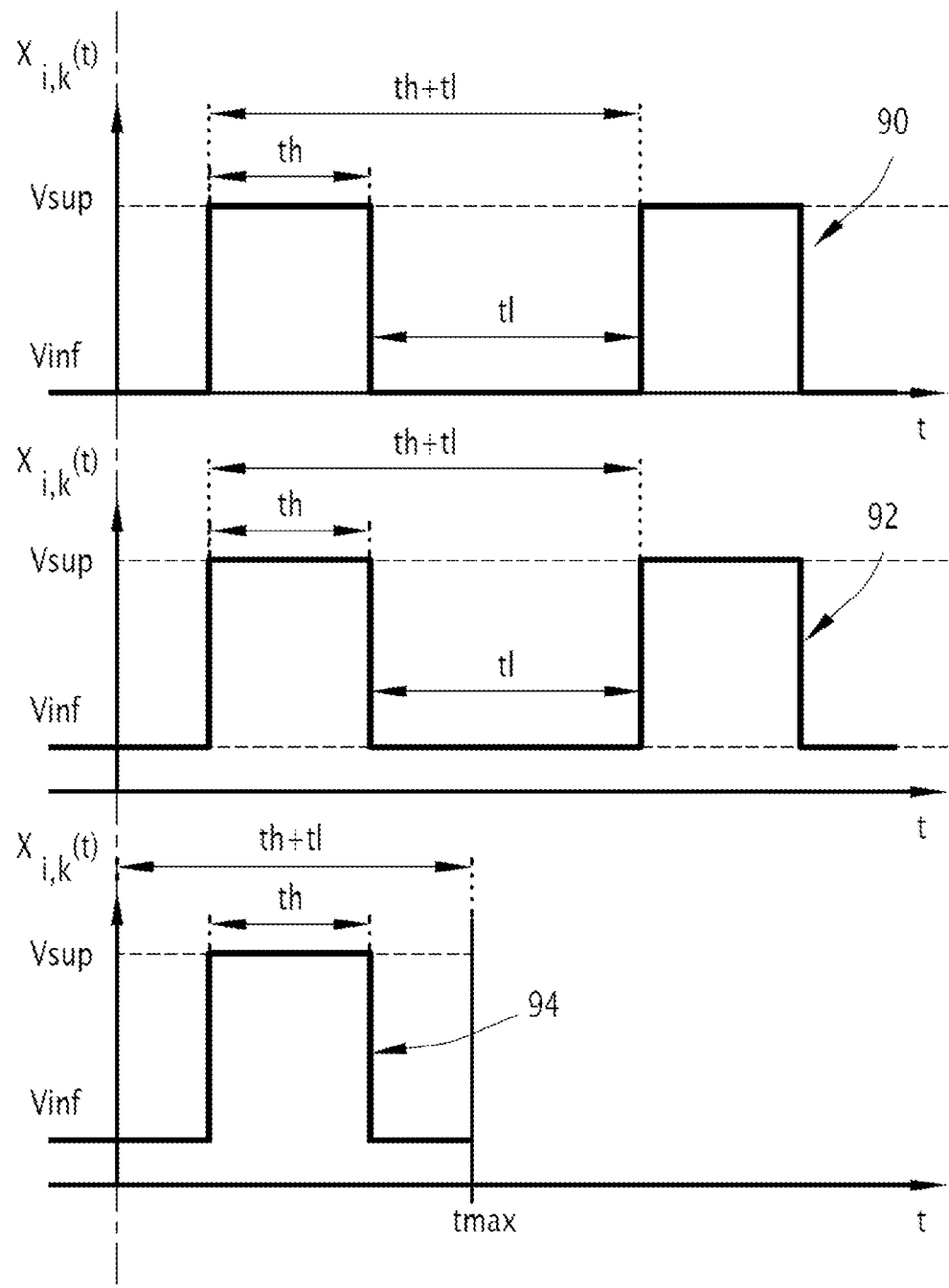
FIG. 7 is a schematic representation of examples of the control timing of the primary switch of the memory cell, during a multiplication operation associated with it.

In this control step 220, the first controller 42 then controls each primary switch 22 of each memory cell 10 of said set with a control signal 90, 92, 94 including an alternation between a lower potential $V_{inf}$ corresponding to the opening of the primary switch 22 and an upper potential $V_{sup}$ corresponding to the closing of the primary switch 22, as shown in the example of FIG. 7.

The duration of an opening step at the lower potential $V_{inf}$ is noted tl, and the duration of a closing step at the higher potential $V_{sup}$ is noted th. The duration of an alternation of opening and closing of the primary switch 22 is then equal to th+tl, as shown in FIG. 7. During this control step 220, this alternating opening and closing of the primary switch 22 then allows to multiply the value of each memristor 20 of said set by a respective multiple $X_{i,k}$ where said respective multiple $X_{i,k}$ is a function of the ratio ρ (denoted ρi for index i row 52) between the cumulative duration of the opening of the respective primary switch 22 during the inference cycle and the duration of said cycle. The respective ratio ρi is associated with the multiple $X_{i,k}$ both of which are for the row 52 of index i.

This multiplication by the respective multiple $X_{i,k}$ is all the more accurate since the transistor 26 forming the primary switch 22 is comparable to a perfect switch. The primary switch 22 is, for example, considered a perfect switch if its resistance in the closed state, noted Rf, is much lower, typically at least five times lower, and preferably at least ten times lower, than the resistance of the memristor 20, noted Rm; and if its resistance in the open state, noted Ro, is much higher, typically at least five times higher, and preferably at least ten times higher, than said resistance Rm of the memristor 20. Furthermore, the transition time, denoted Tr, between the open state and the closed state of said primary switch 22 is preferably much less, typically at least five times less, and preferably at least ten times less, than the duration tl of the opening step at the lower potential $V_{inf}$, and also the duration th of the closing step at the higher potential $V_{sup}$. The primary switch 22 is then typically perfect if it satisfies the following conditions: Rf«Rm, Ro»Rm, Tr«th and Tr«tl.

When the primary switch 22 is comparable to such a perfect switch, the equivalent resistance R(t) of the sub-cell 25 of the corresponding memory cell 10 typically satisfies the following equation:

$$R(t)=(1-x(0)\cdot Rm \quad [1]$$

where R(t) represents the value of the equivalent resistance of the respective sub-cell 25, variable over time t;
x(t) represents a binary control signal for the primary switch 22 of the sub-cell 25, where the upper potential $V_{sup}$ corresponds to the value 1 and the lower potential $V_{inf}$ corresponds to the value 0; and
Rm represents the resistance value of the memristor 20.

This multiplication by the respective multiple $X_{i,k}$ is also all the more accurate because the duration th+tl of an alternating opening and closing of the primary switch 22 is much smaller, typically at least five times smaller, and preferably at least ten times smaller, than a duration τ of charging the capacitor 66 of the measurement module 60 for said column 54.

The duration τ of charging the capacitor 66 then typically satisfies the following equation:

$$\tau=(Rs+\rho\cdot Rm)\cdot C \quad [2]$$

where τ represents the charging time of the capacitor 66;
Rs represents the series resistance of the other sub-cells 25 of column 54 connected in series with the respective sub-cell 25 for which the control signal is applied to the primary switch 22;
ρ represents the ratio of the cumulative open time of the respective primary switch 22 during the inference cycle to the duration of said cycle;
Rm represents the resistance value of the memristor 20 of the respective sub-cell 25; and
C represents the capacitance of the capacitor 66.

This multiplication by the respective multiple $X_{i,k}$ is also all the more accurate as the equivalent resistance R(t) of the corresponding memory cell 10, is much lower, typically at least five times lower, and preferably at least ten times lower, than the series resistance Rs of the other sub-cells 25 in the column 54 connected in series with the respective sub-cell being the object of the inference operation.

To increase the series resistance Rs of the other sub-cells 25 of the column 54 relative to the equivalent resistance R(t) of a respective sub-cell 25, the first controller 42 typically controls the opening and closing of the primary switches 22 of the column 54 with the time instants opening, and respectively closing, that vary from one value line 32 to another. In other words, the starting time instant of the opening step at the lower potential VIII is preferably distinct from one value line 32 to another; and in a similar manner, the starting time instant of the closing step at the higher potential $V_{sup}$ is also distinct from one value line 32 to another.

Alternatively, this shift between the opening, and respectively closing, time instants between the sub-cells 25 of the column 54 is effected by the sub-sets of the sub-cells 25 within said column 54. According to this alternative, the sub-cells 25 of the column 54 are for example divided into B distinct sub-sets, with B an integer greater than or equal to 2. The opening time instants of the primary switch(es) 22 are then identical for the or the sub-cell(s) 25 of the same sub-set, and distinct from one sub-set to another. Similarly, the closing time instants of the primary switch(es) 22 are identical for the sub-cell(s) 25 of the same sub-set, and distinct from one sub-lot to another.

The control signal 90, 92, 94 is preferably periodic, and when it includes several opening and closing alternations of the primary switch 22, then the duration of each opening and closing alternation remains equal to th+tl.

The ratio ρ between the cumulative duration of opening of the respective primary switch 22 during the inference cycle and the duration of said cycle then typically satisfies the following equation:

$$\rho = \frac{tl}{th+tl} \quad [3]$$

where ρ represents said ratio;
tl represents the duration of the opening step of the primary switch 22, th representing the duration of the closing step of said primary switch 22;
th+tl then representing the duration of a respective alternating opening and closing of the primary switch 22.

On FIG. 7, different examples of the signals 90, 92, 94 for controlling the primary switch 22 with this alternation of opening(s) and closing(s) are then represented.

A first control signal 90 includes several alternations of opening and closing of the primary switch 22 during the cycle, with in addition the lower potential $V_{inf}$ of substantially zero value.

Alternatively, a second control signal 92 also includes several opening and closing alternations of the primary switch 22, with the lower potential $V_{inf}$ of strictly positive value according to this alternative. The fact of having the lower potential $V_{inf}$ of strictly positive value, and therefore non-zero, then allows a resultant resistance Rcom of the primary switch 22 which is not zero in the open position of said primary switch 22.

According to this alternative, the equivalent resistance R(t) of the corresponding sub-cell 25 typically satisfies the following equation:

$$R(t) = (1 - x(t)) \cdot \frac{Rm \cdot Rcom}{Rm + Rcom} \qquad [4]$$

where R(t) represents the value of the equivalent resistance of the respective sub-cell 25, variable over the time t;

x(t) represents the binary control signal of the primary switch 22 of the sub-cell 25, where the closing of the primary switch 22 corresponds to the value 1 and its opening corresponds to the value 0;

$R_m$ represents the value of the memristor 20 resistance;

$R_{com}$ represents the resulting resistance of the primary switch 22 in the open position, due to the opening control at a strictly positive potential.

The high HRS state is likely to vary substantially from one memristor 20 to another, with values of this high HRS state varying, for example, between about 40 kΩ and 200 kΩ, which may prove troublesome, being given that the equivalent resistance R(t) is representative of the respective multiple, such as a synaptic weight when the electronic circuit 30 is used for inference of an artificial neural network.

This alternative with the lower potential $V_{inf}$ of strictly positive value then allows to limit this dispersion of resistive values, the value of the equivalent resistance R(t) then being essentially a function of the resulting resistance Rcom when the value of the resistance Rm of the memristor 20 is significantly higher than that of the resulting resistance Rcom, according to equation (4). If the resulting resistance Rcom is, for example, selected to be equal to about 50 kΩ, then the distribution of values for the maximum of the equivalent resistance R(t) will be between about 25 kΩ and 50 kΩ.

This alternative with the lower potential $V_{inf}$ of strictly positive value also allows for better computational efficiency, and in particular for allowing a greater number of sub-cells connected in series in each column 54, being given that the equivalent resistance R(t) of the sub-cell 25 according to this alternative, for example according to the equation (4), is lower than the equivalent resistance R(t) of the sub-cell 25 obtained in the case of the lower potential $V_{inf}$ of substantially zero value, for example according to the equation (1).

Indeed, the skilled person will observe the following inequality relationship:

$$\frac{Rm \cdot Rcom}{Rm + Rcom} < Rm \qquad [5]$$

by the following inequality:

$$\frac{Rcom}{Rm + Rcom} < 1 \qquad [6]$$

Rcom and Rm being strictly positive values.

Alternatively, a third control signal 94 comprises a single alternating opening and closing of the primary switch 22, with the lower potential $V_{inf}$ having a strictly positive value. The duration $t_{max}$ of the inference cycle according to this variant is then equal to the duration th+tl of said opening and closing alternation, that is, to the sum of the duration tl of the opening step and the duration th of the closing step of the primary switch 22.

This alternative with a single opening and closing alternation of the primary switch 22 then requires that the duration $t_{max}$ be much less than the duration τ of charging the capacitor 66 of the measurement module 60 for said column 54, which implies that a voltage threshold Vth, to be reached by the cumulative voltage of the sub-cells 25 of the column 54 for obtaining—during the following step 230—a weighted sum of values of memristors 20 of said set, is much lower, typically at least five times lower, and preferably at least ten times lower, than the reference potential VR allowing to charge the capacitor 66.

This alternative with a single alternation of opening and closing of the primary switch 22 then also allows a better calculation efficiency, since the weighted sum is then calculated more quickly, in a single alternation of opening and closing of the primary switch 22.

The skilled person will then understand that among the first 90, second 92 and third 94 control signals, the third control signal 94 allows for the greatest computational efficiency, being given that it offers the two aforementioned advantages.

The multiply and accumulate method then includes, in step 230, obtaining the weighted sum of the memristor values 20 of said set via a measurement of the cumulative voltage of the memory cells 10 of said column 54, each memristor value 20 being multiplied by the respective multiple $X_{i,k}$.

During this obtaining step 230, the measurement device 50 then effects the measurement of this cumulative voltage for said column 54 via the respective measurement module 60 associated with said column 54, and then typically obtains the weighted sum via the sum of the equivalent resistances of the memristor cells 10 of said column 54 during the inference cycle.

The measurement module 60, for example, calculates this weighted sum from the preceding equation (2), and after determining the charging duration τ of the capacitor 66 associated with said column 54. To determine this duration τ of charging the capacitor 66, the measurement module 60 effects, for example, a reset of the charge of the capacitor 66 by controlling the closing of the reset switch 64 at the beginning of the control step 220, then detects the attainment of the voltage threshold $V_{th}$ corresponding to the charge of the capacitor 66 via the comparator 62, the comparator 62 receiving, on the one hand, the progressively accumulated voltage in the column 54 by having an input connected to the second end 58 of said column 54, and receiving, on the other hand, said voltage threshold $V_{th}$ by having its other input connected to a potential equal to this voltage threshold $V_{th}$. When the voltage threshold $V_{th}$ is attained, the measurement module 60 then determines this duration τ of charging of the capacitor 66, by counting the number of cycles of an internal clock of the comparator 62 that have elapsed between the instant of resetting of the capacitor 66 at the beginning of the control step 220 and the detection of the attainment of said voltage threshold Vth.

As an optional addition, the skilled person will further observe that the measurement device 50 is further configured to obtain the weighted sums for several columns 54 at a time, and preferably for all the columns 54 at a time of the electronic circuit 30.

According to this addition, obtaining the weighted sums for multiple columns 54 simultaneously is accomplished using the following equation:

$$\begin{pmatrix} \tau_1 \\ \vdots \\ \tau_j \\ \vdots \\ \tau_P \end{pmatrix} = C \cdot \begin{pmatrix} R_{1,1} & \cdots & R_{1,I} & \cdots & R_{1,N} \\ \vdots & \ddots & & & \vdots \\ R_{j,1} & & R_{j,I} & & R_{j,N} \\ \vdots & & & \ddots & \vdots \\ R_{P,1} & \cdots & R_{P,I} & \cdots & R_{P,N} \end{pmatrix} \cdot \begin{pmatrix} X_1 \\ \vdots \\ X_I \\ \vdots \\ X_N \end{pmatrix} \quad [7]$$

where I is an integer index associated with the value lines 32, that is, the sub-cells 25 of each respective column 54, and ranging from 1 to M×N, where M represents the number of sub-cells 25 per memory cell 10 and N represents the number of rows 52 of the set 40 of memory cells 10, j is the integer index associated with the columns 54 and varying from 1 to P, where P represents the number of columns 54 of said set 40, $T_j$ represents the charging time of the capacitor 66 associated with the column of index j, C represents the capacitance of the capacitor 66, which is identical from one column 54 to another in the example of equation (7), $R_{i,j}$ represents the resistance value of the memristor 20 of the sub-cell 25 belonging to the column of index j and associated with the row of value of index I, and $X_i$ represents the multiplicative value applied on the value line 32 of index I;

with furthermore by convention:

$$\begin{pmatrix} X_1 \\ \vdots \\ X_I \\ \vdots \\ X_N \end{pmatrix} = \begin{pmatrix} \left(\frac{tl}{th+tl}\right)_1 \\ \vdots \\ \left(\frac{tl}{th+tl}\right)_I \\ \vdots \\ \left(\frac{tl}{th+tl}\right)_N \end{pmatrix} = \begin{pmatrix} \rho_1 \\ \vdots \\ \rho_I \\ \vdots \\ \rho_N \end{pmatrix} \quad [8]$$

where $X_i$ represents the multiplicative value applied to the value line 32 of index I, tl represents the duration of the opening step of the primary switch 22 associated with the value line of index I, and th+tl represents the duration of a respective open and close alternation of the primary switch 22 associated with the value line of index I;

$\rho_i$ alternatively representing the respective ratio for the value line of index I.

The skilled person will observe that the index I representative of a respective value line 32 corresponds to the pair (i,k) of indices i and k, defined above, and that the index I is preferentially used for the pair (i,k) in the preceding equations (7) and (8), in order to avoid having notations with too many indices, in particular for the resistance value of the memristor 20.

The skilled person will then understand that the memory cell 10 according to the invention allows the writing, then the reading and/or the inference, of any value, in the form of the electrical resistance value of the memristor 20 included in each sub-cell 25 of the memory cell 10, and not only of a binary value unlike the memory cell of the prior art.

Furthermore, each sub-cell 25 allows for the multiplication of a value of the memristor by a respective multiple $X_{i,k}$, via alternating opening and closing of the primary switch 22 during an inference cycle, as explained above.

The skilled person will further observe that the respective multiple $X_{i,k}$ is capable of taking any value, and is also not limited to a binary value. In the example of the preceding equation (8), the respective multiple $X_{i,k}$ is a real number between 0 and 1.

The skilled person will also note that the electronic circuit 30 according to the invention further allows the implementation of the multiply and accumulate MAC operation in a particularly efficient manner, in particular with the various gains in computational efficiency described above.

The electronic circuit 30 according to the invention further provides a possible implementation of the MAC operation for several columns 54 at a time, for example via the implementation of the preceding equation (7). During the inference of an artificial neural network, this then allows to chain the weighted sum calculations for several successive layers of the neural network, without waiting for example for the end of the MAC operation for a previous layer of the network.

Each sub-cell 25 also presents a smaller footprint than the state-of-the-art memory cell, each sub-cell 25 including one less memristor and one less switch than the state-of-the-art 2T2R type memory cell, the sub-cell 25 according to the first embodiment of the invention being 1T1R type.

FIGS. 10 to 13 illustrate a second embodiment for which the elements similar to those of the first embodiment described above are marked by identical references and are not described again.

According to the second embodiment, the memory cell 10 further includes M tertiary switches 300, each connected to a respective memristor 20, the tertiary switch 300 and the memristor 20 being connected in series, in parallel with the associated primary switch 22.

Figure 10:
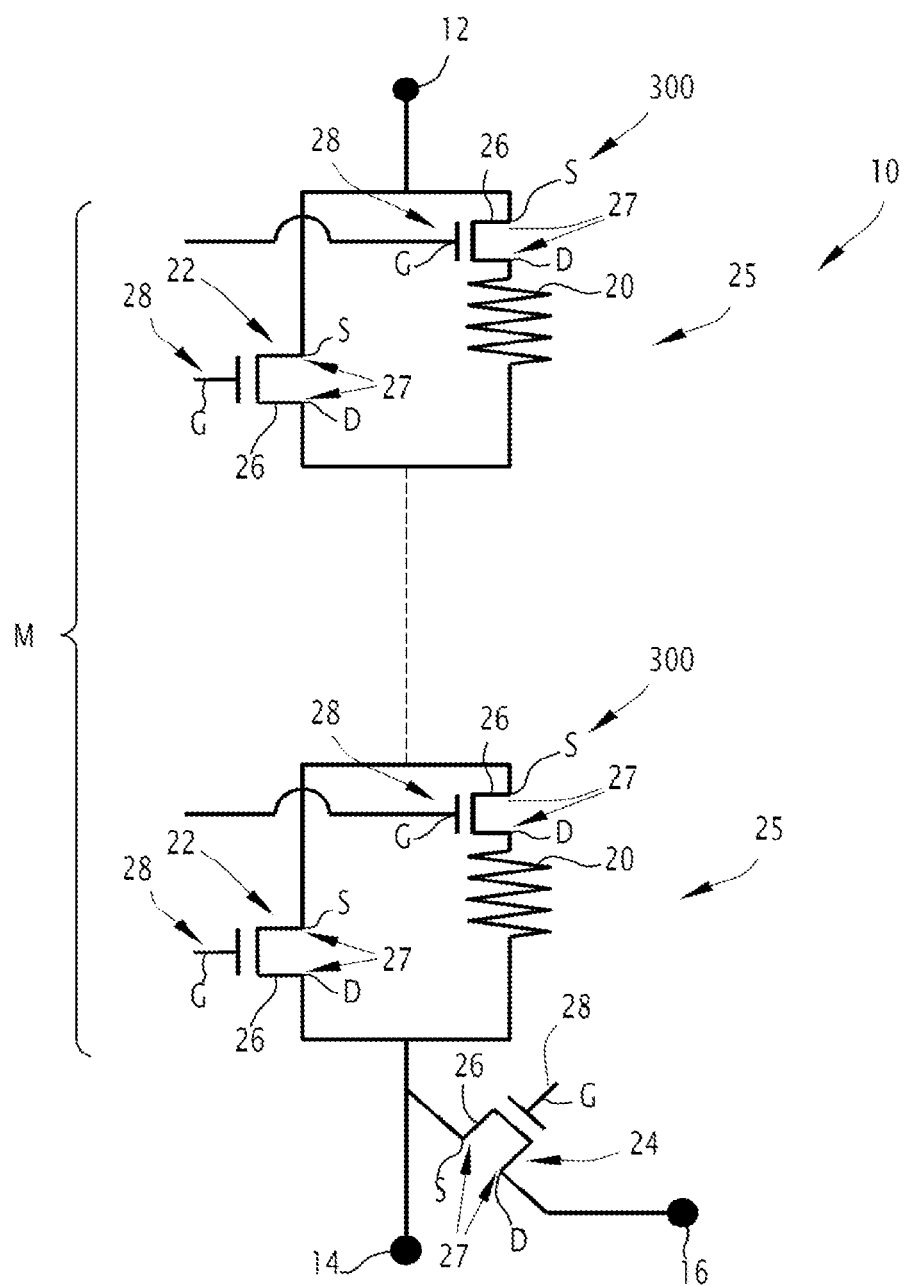
FIG. 10 is a view similar to that of FIG. 1, according to a second embodiment of the invention, where the memory cell further comprises M tertiary switches, each being connected to a respective memristor, the tertiary switch and the memristor being connected in series, in parallel with the associated primary switch, with M an integer greater than or equal to 1.

In the example of FIG. 10, the memory cell 10 comprises exactly M memristors 20.

In the example of FIG. 10, the memory cell 10 comprises exactly 2M+1 switches 22, 24, 300.

In the example of FIG. 10, the memory cell 10 is then constituted of the first and second main terminals 12, 14, the auxiliary terminal 16, the memristor 20, and the primary, secondary, and tertiary switches 22, 24, 300.

In the example of FIG. 10, the memory cell 10 is therefore a (2M+1)TMR memory cell, referring to the presence of 2M+1 switches (denoted (2M+1)T) and M memristor(s) (denoted MR), and each sub-cell 25 is a 2T1R type.

In the example shown in FIG. 10, the integer M is strictly greater than 1.

When the number M is strictly greater than 1, the skilled person will understand that the writing of a given value in a respective memristor 20 is obtained in particular via the opening of the primary switch 22 in parallel with said memristor 20, and the closing of the M−1 other primary switch(es) 22, which then corresponds to the case where any other possible primary switch(es) 22 are to be closed.

According to this second embodiment, the writing of the given value to the respective memristor 20 is further obtained via the closing of the tertiary switch 300 in series with said memristor 20.

When the number M is alternatively equal to 1, the skilled person will also understand that the writing of a given value in the memristor 20 of the memory cell 10 is obtained in particular via the opening of the primary switch 22 which is arranged in parallel with the said memristor 20, the closing of the tertiary switch 300 in series with the said memristor 20, and that there is then no other possible primary switch 22 to be closed in this case.

The skilled person will then observe that the memory cell 10 according to the invention is a 3T1R type cell in the case where M is equal to 1, and then includes one memristor less than the 2T2R type memory cell of the prior art.

The skilled person will note more generally that in the example of FIG. 10, for M greater than 1, the memory cell 10 of type (2M+1)TMR according to the invention allows to write M distinct value(s), then to read and/or infer these values, each of the M sub-cells 25 being associated with a respective value; and that the memory cell 10 is therefore comparable to M memory cells of type 2T2R of the state of the art, each sub-cell 25 of type 2T1R according to the invention being comparable to the memory cell of type 2T2R of the state of the art. The skilled person will then understand that the memory cell 10 according to the invention includes M fewer memristors than the corresponding M type 2T2R memory cells of the state of the art, or even that each sub-cell 25 of type 2T1 R according to the invention includes one fewer memristor than the type 2T2R memory cell of the state of the art.

The tertiary switch 300 is also referred to as a tertiary switch. The tertiary switch 300 is, for example, realized in the form of the transistor 26. It includes, as known per se, the two conduction electrodes 27 and the control electrode 28.

In the example of FIG. 10, the transistor 26 forming the tertiary switch 300 of a first sub-cell 25 connected directly to the first main terminal 12 is connected by its source electrode S to said first main terminal 12, and by its drain electrode D to the memristor 20 of said first sub-cell 25. The transistor 26 forming the tertiary switch 300 of a respective sub-cell 25 of the series is connected by its source electrode S to the preceding sub-cell 25, in particular to the drain electrode D of the transistor 26 forming the primary switch 22 of said preceding sub-cell 25; and respectively by its drain electrode D to the memristor 20 of the respective sub-cell 25. The transistor 26 forming the tertiary switch 300 of the last sub-cell connected directly to the second main terminal 14 is connected by its source electrode S to the preceding sub-cell 25, and by its drain electrode D to the memristor 20 of said last sub-cell 25.

Figure 11:
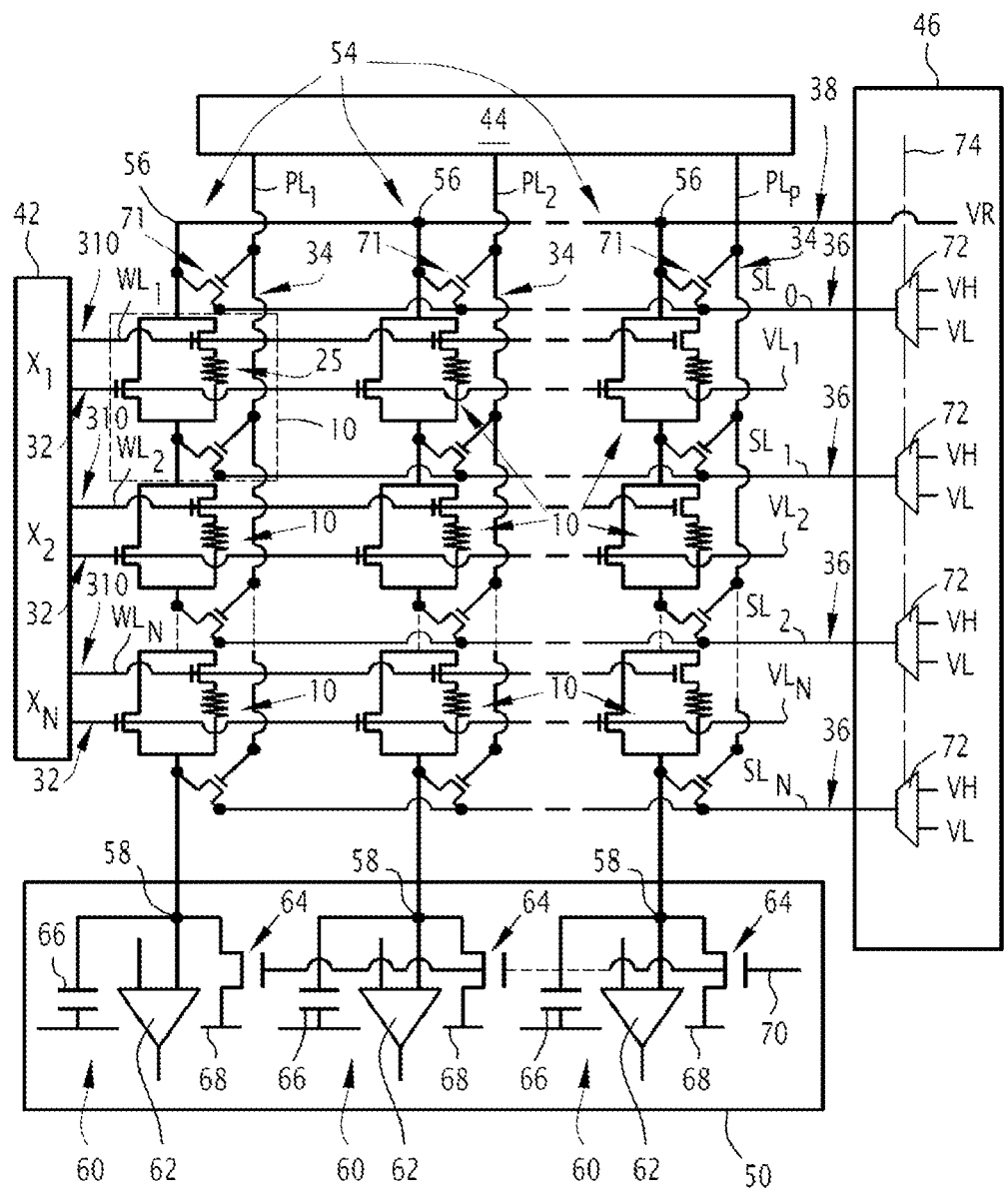
FIG. 11 is a view similar to that of FIG. 5, according to the second mode of realization of the invention, each memory cell being of the type of the memory cell of FIG. 10.

According to the second embodiment, the electronic circuit 30 further comprises complementary programming lines 310, as shown in FIG. 11. For each memory cell 10, the control electrode 28 of each tertiary switch 300 is connected to a respective complementary programming line 310.

According to this second embodiment, the set 40 of memory cells 10 is similarly typically arranged in the form of the matrix including the rows 52 and columns 54.

The complementary programming lines 310 are also denoted $WL_{i,k}$ with i the integer index ranging from 1 to M where M represents the number of memristors 20 in each memory cell 10, which is equal to the number of tertiary switches 300 within each memory cell 10, M then also representing the number of tertiary switches 300 within each memory cell 10; and k the integer index ranging from 1 to N, where N represents the number of rows 52. More specifically, the complementary programming lines 310 are then denoted $WL_{1,1}, \ldots, WL_{M,1}$ for the first row 52 with index k equal to 1; then $WL_{1,2}, WL_{2,2}, WL_{M,2}$ for the second row 52 with index k equal to 2; up to $WL_{1,N}, WL_{2,N}, WL_{M,N}$ for the last row 52 with index k equal to N.

In the example shown in FIG. 11, the number M is equal to 1, and the index i is not required. The complementary programming lines 310 are also denoted $WL_k$ with k the integer index varying from 1 to N, where N represents the number of rows 52. More specifically, the complementary programming lines 310 are then denoted $WL_1, WL_2, \ldots, WL_N$.

In a manner similar to what was described above for the first embodiment, the skilled person will also understand that in practice the set 40 includes a much larger number of memory cells 10, than that in the example of FIG. 11 where the number of memory cells represented is limited for the sake of simplifying the drawing.

Figure 12:
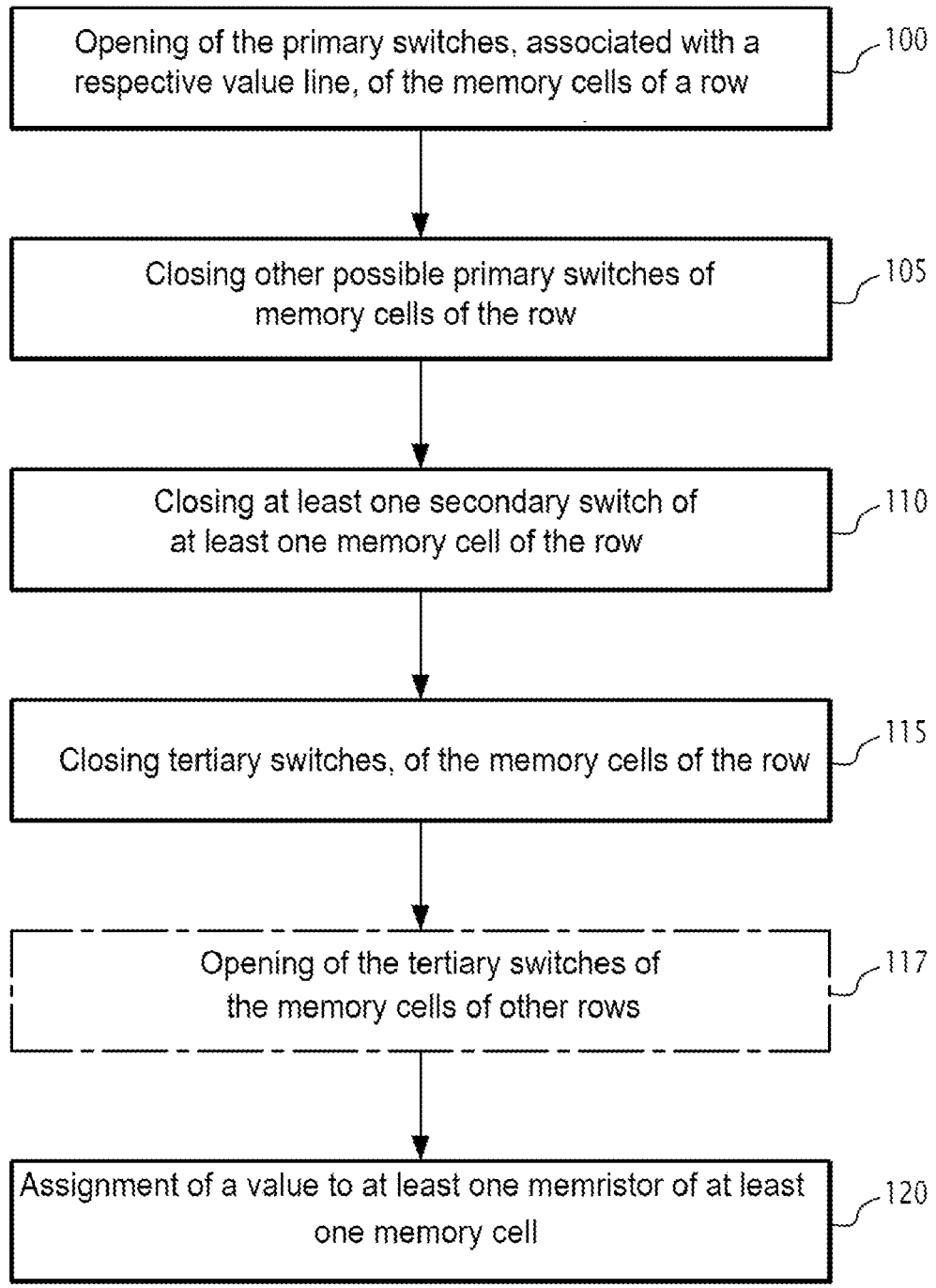
FIG. 12 is a view similar to that of FIG. 8, according to the second embodiment of the invention.
Figure 13:
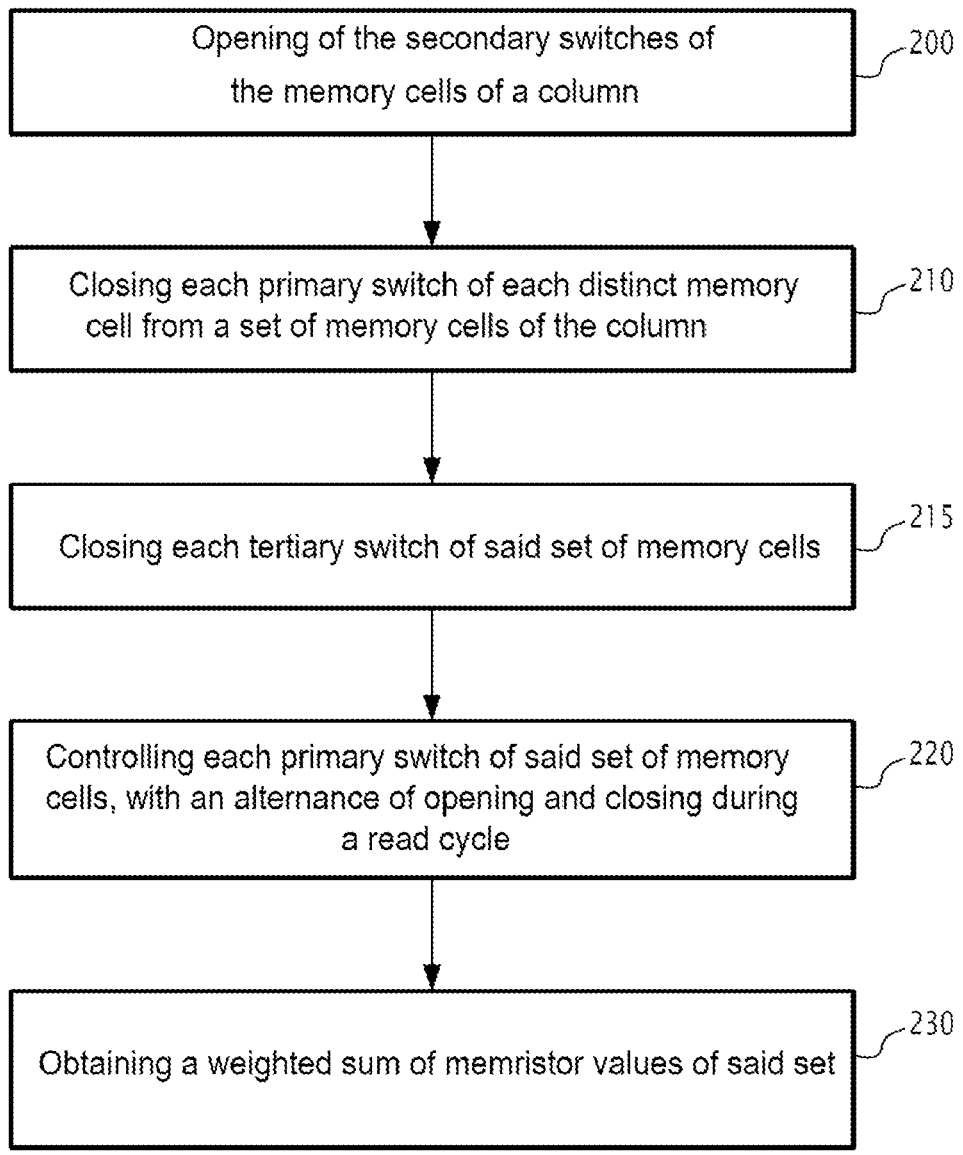
FIG. 13 is a view similar to that of FIG. 9, according to the second embodiment of the invention.

According to the second embodiment, the first controller 42 is configured to further control each of the complementary programming lines 310 connected to the control electrodes 28 of the tertiary switches 300 of the set 40 of memory cells, as a function of the operation effected on the memory cells 10, in particular from among the programming operation when the programming method is implemented, and respectively the inference operation when the multiply and accumulate method is implemented, as will be described in more detail hereinafter with respect to FIG. 12, and respectively to FIG. 13; as well as the reading operation when the reading method according to the invention is implemented.

The first controller 42 is, for example, further configured to control the closing of tertiary switches 300 of a respective row 52, during programming of the memory cell(s) 10 of said row 52.

Alternatively, the first controller 42 is configured to control the closing of the tertiary switches 300 connected to a respective complementary programming line 310 associated with said row and the opening of any other possible tertiary switches 300 of memory cells of said row 52, such other possible tertiary switches 300, then being connected to other complementary programming lines 310 than the one to which a close signal is applied.

The skilled person will then observe that this alternative allows only the tertiary switch 300 of the sub-cell 25 being programmed to be closed and any other tertiary switches 300 of the memory cell 10 to be opened. The skilled person will then of course understand that the complementary programming line 310 to which the close signal is applied is that associated with the sub-cell 25 which is itself associated with the value line 32 to which the open signal is applied, being given that programming of a respective sub-cell 25 requires both the opening of the primary switch 22 and the closing of the tertiary switch 300 of said sub-cell 25.

As an optional addition, the first controller 42 is further configured to control the opening of the tertiary switches 300 of the or the row(s) other than the respective row 52 being the object of the programming of the memory cell(s) 10.

The first controller 42 is, for example, configured, during the implementation of an inference operation with a set of memory cell(s) 10 of a respective column 54, to control the closing of the tertiary switch(es) 300 of said set of memory cell(s) 10 of the column 54.

The skilled person will then understand that opening the tertiary switches 300 of the or the row(s) other than the respective row 52 being the object of the programming of the memory cell(s) 10 then allows for greater flexibility in controlling the source lines 36, since it is then necessary to control only the potential of the two source lines 36 located on either side of the row 52 being the object of the programming, that is, to apply the first electric potential V1 only to the source line 36 on the side of the first main terminal 12 of each memory cell 10 of said row 52, and respectively to apply the second electric potential V2 only to the source line 36 connected to the auxiliary terminal 16 of each memory cell 10 of said row 52, the potentials applied to the other source lines 36 being indifferent.

The skilled person will also understand that closing the tertiary switches 300 of a respective row 52, during the programming of the memory cell(s) 10 of said row 52, further provides the possibility of limiting the current flowing through each memristor 20 of each memory cell 10 being the object of said programming, by then applying, for example, the predefined limiting potential VCOMPL to the control electrode 28 of each corresponding tertiary switch 300 via the associated complementary programming line 310.

Also, although it is possible according to the second embodiment, that the electronic circuit 30 also includes, as an optional addition, the auxiliary switches 80 connected to the source lines 36, similar to the alternative embodiment of FIG. 3 in the case of the first embodiment, the skilled person will understand that this optional addition presents less interest according to the second embodiment, since it is then already possible to limit the current flowing through each memristor 20 of each memory cell 10 by each respective tertiary switch 300.

Other advantages of this second embodiment are similar to those of the first embodiment described above and are not described again.

The operation of this second embodiment is similar to that of the first embodiment described above, and will now be described with reference to FIG. 12 showing a flowchart of the programming method of at least one memory cell 10 of a respective row 52 of memory cells 10 according to the second embodiment; and then with reference to FIG. 13 showing a flowchart of the method of multiplying and accumulating a set of memory cell(s) 10 of a respective column 54 of memory cells 10 according to the second embodiment.

In FIG. 12, the programming method comprises the step 100 of opening the primary switches 22 of the memory cells 10 of a respective row 52, this step being identical to the opening step 100 previously described for the first embodiment with respect to FIG. 8, and therefore not described again.

The programming method also comprises the step 105 of closing any other possible primary switches 22 of the memory cells 10 of said row 52, this step being identical to the closing step 105 previously described for the first embodiment with respect to FIG. 8, and therefore not described again.

The programming method also comprises the step 110 of closing at least one secondary switch 24 of at least one memory cell 10 of said row 52, this step being identical to the closing step 110 previously described for the first embodiment in FIG. 8, and therefore not being described again.

The programming method further comprises a step 115 of closing the tertiary switches 300 of the memory cells 10 of said row 52, via the application of a close command to the complementary programming line 310 connected to said row 52.

During this closing step 115, the first controller 42 then controls the closing of the tertiary switches 300 of said row 52.

Alternatively, during this closing step 115, the first controller 42 controls the closing of the tertiary switches 300 connected to a respective complementary programming line 310 associated with said row and the opening of any other possible tertiary switches 300 of the memory cells 10 of said row 52, these other possible tertiary switches 300 being then connected to complementary programming lines 310 other than the one to which a closing signal is applied. The complementary programming line 310 to which the close signal is applied is that associated with the sub-cell 25 which is itself associated with the value line 32 to which the open signal is applied, the programming of a respective sub-cell 25 requiring both the opening of the primary switch 22 and the closing of the tertiary switch 300 of said sub-cell 25.

As an optional addition, the programming method further comprises a step 117 of opening the other tertiary switches 300, that is, the tertiary switches 300 for the row(s) 52 other than the one being the object of the programming, via the application of an open command on the or the other complementary programming line(s) 310 of the electronic circuit 30.

During this optional opening step 117, the first controller 42 then controls the opening of the tertiary switches 300 of the or the said other row(s) 52.

Following these steps 100, 105, 110, 115, and optionally 117, the programming method comprises the assignment step 120 which is similar to that described above for the first embodiment.

According to the second embodiment, during the assignment step 120, the first electric potential V1 is preferably applied to the only source line 36 connected to the at least one first main terminal 12 and the second electric potential V2 being applied to the only source line 36 connected to the at least one auxiliary terminal 16 of said row 52. According to this second embodiment, the electric potential applied to any other possible source lines 36 is then indifferent, as explained above.

In FIG. 13, the multiply and accumulate method comprises the step 200 of opening the secondary switches 24 of the memory cells 10 of the column 54 being the object of this multiply and accumulate, this step being identical to the opening step 200 previously described for the first embodiment with respect to FIG. 9, and thus not described again.

If the set of memory cell(s) 10 being the object to such multiplication and accumulation does not include all of the memory cells 10 in the corresponding column 54, the multiply and accumulate method according to the second embodiment also comprises the step 210 of closing each primary switch 22 of each distinct memory cell 10 of said set within said column 54, which is identical to that previously described for the first embodiment with respect to FIG. 9, and is thus not described again.

The multiply and accumulate method according to the second embodiment further comprises, before the control step 220, a step 215 of closing each tertiary switch 300 of said set, via the application of a close command to each complementary programming line 310 connected to each tertiary switch 300 of said set.

During this closing step 215, the first controller 42 then controls the closing of each tertiary switch 300 of said set.

Following these steps 200, 210 and 215, the multiply and accumulate method comprises the control step 220, then the obtaining step 230, each of which is identical to those previously described for the first embodiment in FIG. 9 and is thus not described again.

In addition, and regardless of the embodiment, the skilled person will further understand that the memory cell 10 according to the invention, and the associated electronic circuit 30, also allow a simple reading method of a set of memory cell(s) 10 of a respective column 54, this simple reading method being a simplified version of the multiplication and accumulation method described previously by having a multiple equal to 1 for each memory cell 10 being the object of this simple reading.

This simple reading is then effected via the opening of each primary switch 22 of said set being the object of this reading; and if said set does not include all of the memory cells of said column 54, via further closing each primary switch 22 of each distinct memory cell 10 of said set.

The skilled person will then note that having only the opening of each primary switch 22 of said set during the inference cycle corresponds to a multiple equal to 1, the cumulative duration of opening of said primary switch 22 then being equal to the duration of said inference cycle, so that the aforementioned ratio ρ is equal to 1.

Nevertheless, the skilled person will understand that the reading of at least one memory cell 10 of a respective row 52 is preferably effected with a reading method comprising the following steps:

opening primary switches 22 of the memory cells 10 of said row 52, via the application of an open command on a respective value line 32 connected to said row 52;

closing any other possible primary switches 22 of the memory cells 10 of said row 52, via the application of a close command to the or the other possible value line(s) 32 connected to said row 52;

closing the at least one secondary switch 24 of said at least one memory cell 10, via the application of a close command to the at least one programming line 34 connected to said at least one memory cell 10 of said row 52;

reading a value of at least one memristor 20 of said at least one memory cell 10, with a respective read voltage between the at least one main terminal 12 and the at least one auxiliary terminal 16 of said at least one memory cell 10 via the application of a third electric potential V3 to the source lines 36 arranged on the side of the at least one first main terminal 12 and of a fourth electric potential V4 to the other source lines 36, arranged on the side of the at least one auxiliary terminal 16, the read voltage being equal to the difference between the third and fourth potentials V3, V4, the or each primary switch 22 in parallel with said at least one memristor 20 to be read being open.

The read voltage is then typically about 0.1 to 0.4 volts, and it is for example obtained by setting the value VH to this value of about 0.1 to 0.4 volts, the value VL to a substantially zero value, and if necessary the value VCOMPL to VDD.

It is then conceived that the memory cell 10 according to the invention, and the associated electronic circuit 30, allow the implementation of all types of neural networks, and in particular neural networks other than only binary neural networks, also called BNN.

The invention claimed is:

1. A memory cell, comprising:
a first main terminal, a second main terminal and an auxiliary terminal;
M memristor(s) connected between the two main terminals, M being an integer greater than or equal to 1;
M primary switch(es), each being connected in parallel to a respective memristor; and
a secondary switch connected between the second main terminal and the auxiliary terminal;
the memory cell being configured to write a respective value to the at least one memristor via the opening of the or each primary switch in parallel with said at least one memristor, closing the or each other possible primary switch, closing the secondary switch and the application of a corresponding programming voltage between the first main terminal and the auxiliary terminal;
the memory cell being configured to read a respective value in at least one memristor via the opening of the or each primary switch in parallel with said at least one memristor, closing the or each other possible primary switch, opening the secondary switch and measuring a corresponding electric quantity between the two main terminals.

2. The memory cell according to claim 1, wherein the memory cell is further configured for multiplying a value of at least one respective memristor by a multiple; via alternating opening and closing of the or each primary switch in parallel with said at least one memristor during an inference cycle, the closing of the or each other possible primary switch, the opening of the secondary switch and the measurement of a corresponding electrical quantity between the two main terminals, a ratio between a cumulative duration of opening of the or each primary switch in parallel with said at least one memristor during the inference cycle and a duration of said inference cycle being representative of the multiple.

3. The memory cell according to claim 1, wherein the memory cell further comprises M tertiary switch(es), each being connected to a respective memristor, the tertiary switch and the memristor being connected in series, in parallel with the associated primary switch.

4. The memory cell according to claim 3, wherein the memory cell consists of the first and second main terminals, the auxiliary terminal, the memristor, and the primary, secondary and tertiary switches.

5. The memory cell according to claim 1, wherein M is equal to 1, and the memory cell is then configured to write a respective value via the opening of the primary switch, closing the secondary switch, and applying a corresponding programming voltage between the first main terminal and the auxiliary terminal; the memory cell being configured to read a respective value via the opening of the primary switch, opening the secondary switch and measuring a corresponding electrical quantity between the two main terminals.

6. The memory cell according to claim 1, wherein M is strictly greater than 1, the M memristors are connected in series between the two main terminals, and the memory cell is configured for writing a respective value to a memristor via the opening of the primary switch in parallel with said memristor, closing the or each other primary switch, closing the secondary switch and applying a corresponding programming voltage between the first main terminal and the auxiliary terminal; the memory cell being configured to read a respective value in a memristor by opening the primary switch in parallel with said memristor, closing the or each other primary switch, opening the secondary switch and measuring a corresponding electrical quantity between the two main terminals.

7. An electronic circuit, comprising:
   value lines;
   programming lines;
   source lines; and
   a set of memory cells, each memory cell being according to claim 1,
   for each memory cell, a control electrode of a respective primary switch being connected to a respective value line, a control electrode of the secondary switch being connected to a respective programming line, and the auxiliary terminal being connected to a respective source line.

8. The electronic circuit according to claim 7, wherein the memory cells are arranged in columns, the memory cells of a same column being connected in series with each other, and the electronic circuit further comprises measurement modules, each column including a first end connected to a reference potential and a second end connected to a respective measurement module, each measurement module including a reset switch and a capacitor configured, on the one hand, to be charged by a cumulative voltage of the memory cells of the respective column during a measurement phase, the reset switch then being open; and on the other hand, to be discharged by connecting to an electrical ground via the closing of the reset switch during a reset phase.

9. The electronic circuit according to claim 7, wherein the electronic circuit further comprises complementary programming lines, and for each memory cell a control electrode of a respective tertiary switch is connected to a respective complementary programming line.

10. The electronic circuit according to claim 7, wherein the electronic circuit further comprises multiplexers, each source line being connected to a respective multiplexer, each multiplexer being configured to select, as a function of a selection signal and from among a plurality of predefined values, an electric potential value to be applied to the associated source line.

11. The electronic circuit according to claim 7, wherein the electronic circuit further comprises auxiliary switches, each source line being connected to a respective auxiliary switch, each auxiliary switch being configured to, in case of receipt of a limitation command, limit an electric current flowing in the associated source line.

12. The electronic circuit according to claim 11, wherein each auxiliary switch is a transistor, and the limitation command being a predefined limiting potential applied to a control electrode of said auxiliary switch.

13. The electronic circuit according to claim 11, wherein the electronic circuit further comprises auxiliary multiplexers, the control electrode of each auxiliary switch being connected to a respective auxiliary multiplexer, each auxiliary multiplexer being configured to select, as a function of a limit signal and from among a plurality of predefined values, an electric potential value to be applied to the associated control electrode.

14. The electronic circuit according to claim 9, wherein the memory cells are arranged in rows, and the memory cells in the same row are further connected to M same complementary programming line(s).

15. The electronic circuit according to claim 8, wherein each measurement module is configured to measure a cumulative voltage of the memory cells in the column to which it is connected.

16. The electronic circuit according to claim 15, wherein the electronic circuit further comprises a reference line to which the reference potential is applied, the first ends of the columns then being connected to the reference line.

17. The electronic circuit according to claim 15, wherein each measurement module also includes a comparator configured to detect when the cumulative voltage of the memory cells of the respective column attains a respective predefined threshold voltage.

18. A method of programming at least one memory cell of a respective row of memory cells of an electronic circuit according to claim 14, the method comprising:
   opening of the primary switches of the memory cells of said row, via the application of an open command on a respective value line connected to said row;
   closing any other possible primary switches of the memory cells of said row, by the application of a close command on the other possible value line(s) connected to said row;
   closing of the at least one secondary switch of said at least one memory cell, via the application of a close command on the at least one programming line connected to said at least one memory cell of said row;
   closing the tertiary switches of the memory cells of said row, via the application of a close command on the one or more complementary programming lines connected to said row;
   assigning a value to at least one memristor of said at least one memory cell, with a programming voltage corresponding to the value between the at least one main terminal and the at least one auxiliary terminal of said at least one memory cell by applying a first electric potential to the source line(s) arranged on the side of the at least one first main terminal and a second electric potential to the other source line(s), arranged on the side of the at least one auxiliary terminal, the programming voltage corresponding to the assigned value being equal to the difference between the first and second potentials, the or each primary switch in parallel with the at least one memristor being open.

19. The method according to claim 18, wherein the method further comprises: during the assignment step, the first electric potential is applied to the only source line connected to the at least one first main terminal and the second electric potential being applied to the only source line connected to the at least one auxiliary terminal of said row.

20. The method according to claim 18, wherein the method further comprises, before the assignment step, a step of opening the other tertiary switches, via the application of an open command to the or the other complementary programming line(s) of the electronic circuit.

21. A method for multiplying and accumulating a set of memory cell(s) of a respective column of memory cells of an electronic circuit according to claim 12, the method comprising:
   opening the secondary switches of the memory cells of said column, via the application of an open command on the programming line connected to said column;
   if said set does not include all memory cells in said column, closing each primary switch of each distinct memory cell in said set within said column, by the application of a close command to each value line connected to each distinct memory cell in said set;

controlling each primary switch of said set of memory cell(s) with alternating opening and closing during an inference cycle, via the application of alternating open and close commands on each value line connected to each primary switch of said set, to multiply the value of each memristor of said set by a respective multiple; a ratio between a cumulative duration of opening of the respective primary switch during the inference cycle and a duration of said cycle being representative of the respective multiple;

obtaining a weighted sum of memristor value(s) of said set, each memristor value being multiplied by the respective multiple, via a measurement of the cumulative voltage of the memory cells of said column.

22. The method according to claim 21, wherein the method further comprises, before the control step, a step of closing each tertiary switch of said set, via the application of a close command on each complementary programming line connected to each tertiary switch of said set.

\* \* \* \* \*